(12) United States Patent
Gerardi

(10) Patent No.: US 11,243,576 B2
(45) Date of Patent: Feb. 8, 2022

(54) MODULAR COMPUTING SYSTEM

(71) Applicant: Luca Gerardi, Rome (IT)

(72) Inventor: Luca Gerardi, Rome (IT)

(73) Assignee: Luca Gerardi, Rome (IT)

( * ) Notice: Subject to any disclaimer, the term of this patent is extended or adjusted under 35 U.S.C. 154(b) by 0 days.

(21) Appl. No.: 16/341,230

(22) PCT Filed: Oct. 13, 2017

(86) PCT No.: PCT/IB2017/056361
§ 371 (c)(1),
(2) Date: Apr. 11, 2019

(87) PCT Pub. No.: WO2018/069883
PCT Pub. Date: Apr. 19, 2018

(65) Prior Publication Data
US 2019/0258300 A1    Aug. 22, 2019

(30) Foreign Application Priority Data
Oct. 14, 2016 (IT) .......................... 102016000103458

(51) Int. Cl.
*G06F 1/16* (2006.01)
*H05K 5/02* (2006.01)
*H04M 1/02* (2006.01)

(52) U.S. Cl.
CPC ............ *G06F 1/1656* (2013.01); *G06F 1/166* (2013.01); *G06F 1/1607* (2013.01);
(Continued)

(58) Field of Classification Search
CPC .... G06F 1/1656; G06F 1/1632; G06F 1/1654; G06F 1/1675; G06F 1/1607;
(Continued)

(56) References Cited

U.S. PATENT DOCUMENTS 6,031,714 A    2/2000  Ma
6,430,038 B1*  8/2002  Helot .................... G06F 1/1616
                                                      248/917
(Continued)

FOREIGN PATENT DOCUMENTS

| CN | 105739619 A | 7/2016 |
| EP | 1826471 A2 | 8/2007 |
| WO | 2017006094 A1 | 1/2017 |

OTHER PUBLICATIONS

Anonymous: "Huawei Honor 7i With 13-Megapixel Rotating Camera, 5.2-Inch Display Launched 1Technology News", Aug. 20, 2015 (Aug. 20, 2015), XP055441236, Retrieved from the Internet: URL:https://gadgets.ndtv.com/mobiles/news/ huawei-honor-7i-with-13-megapixel-rotating -camera-52-inch-display-launched-730172 [retrieved on Jan. 16, 2018]the whole document.

*Primary Examiner* — Abhishek M Rathod

(74) *Attorney, Agent, or Firm* — Arent Fox LLP; Michael Fainberg

(57) ABSTRACT

Display provided with a screen arranged in a casing having a substantially parallelepiped shape, wherein a first seat for housing a mobile communication and/or computing device is arranged on the rear side of the display, wherein the rear side of the display is provided with a second seat in which a foldable support can be arranged at least partially, wherein the foldable support comprises at least one first portion rotatably connected to the display by means of one or more first hinges and at least one second portion rotatably connected to the first portion by means of one or more second hinges. The present disclosure relates also to a computing system comprising said display.

22 Claims, 20 Drawing Sheets

(52) U.S. Cl.
CPC .......... *G06F 1/1618* (2013.01); *G06F 1/1632* (2013.01); *G06F 1/1654* (2013.01); *G06F 1/1669* (2013.01); *G06F 1/1675* (2013.01); *G06F 1/1679* (2013.01); *G06F 1/1681* (2013.01); *G06F 1/1684* (2013.01); *G06F 1/1686* (2013.01); *H04M 1/0264* (2013.01); *H05K 5/0286* (2013.01); *G06F 2200/1612* (2013.01)

(58) Field of Classification Search
CPC .... G06F 1/1686; G06F 1/1684; G06F 1/1679; G06F 1/166; G06F 1/1669; G06F 1/1681; G06F 1/1618; G06F 2200/1612; H04M 1/0264; H05K 5/0286
See application file for complete search history.

(56) References Cited

U.S. PATENT DOCUMENTS

| | | |
|---|---|---|
| 6,489,932 B1 | 12/2002 | Chitturi et al. |
| 6,807,050 B1 | 10/2004 | Whitehorn et al. |
| 10,400,942 B2 * | 9/2019 | Ren .................. G06F 1/166 |
| 2005/0014527 A1 * | 1/2005 | Chambers .......... H04M 1/0264 |
| | | 455/556.1 |
| 2005/0057518 A1 | 3/2005 | Ghosh et al. |
| 2008/0024436 A1 * | 1/2008 | Morooka .............. G06F 1/1613 |
| | | 345/156 |
| 2010/0014272 A1 | 1/2010 | Hoire |
| 2011/0199726 A1 * | 8/2011 | Moser .................. G06F 1/1616 |
| | | 361/679.09 |
| 2012/0011293 A1 * | 1/2012 | Cheng .................. G06F 1/1632 |
| | | 710/303 |
| 2012/0188693 A1 | 7/2012 | Chiang et al. |
| 2013/0080670 A1 * | 3/2013 | Medica ................ G06F 1/1626 |
| | | 710/110 |
| 2014/0035834 A1 * | 2/2014 | Sharma .................. A63F 13/92 |
| | | 345/173 |
| 2015/0070834 A1 * | 3/2015 | Kim ...................... G06F 1/1656 |
| | | 361/679.41 |
| 2016/0239048 A1 * | 8/2016 | Mehandjiysky ...... G06F 1/1626 |
| 2017/0123456 A1 * | 5/2017 | Chung ................. G06F 1/1632 |
| 2017/0303415 A1 * | 10/2017 | Deily .................... F16M 11/10 |

* cited by examiner

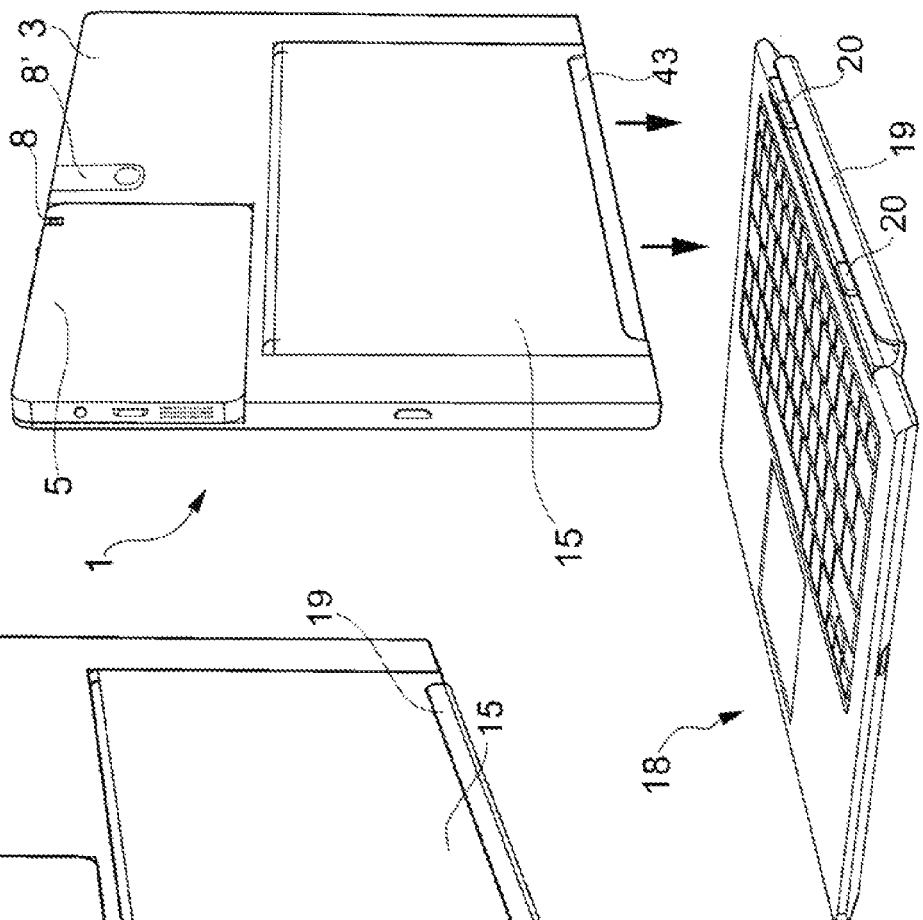

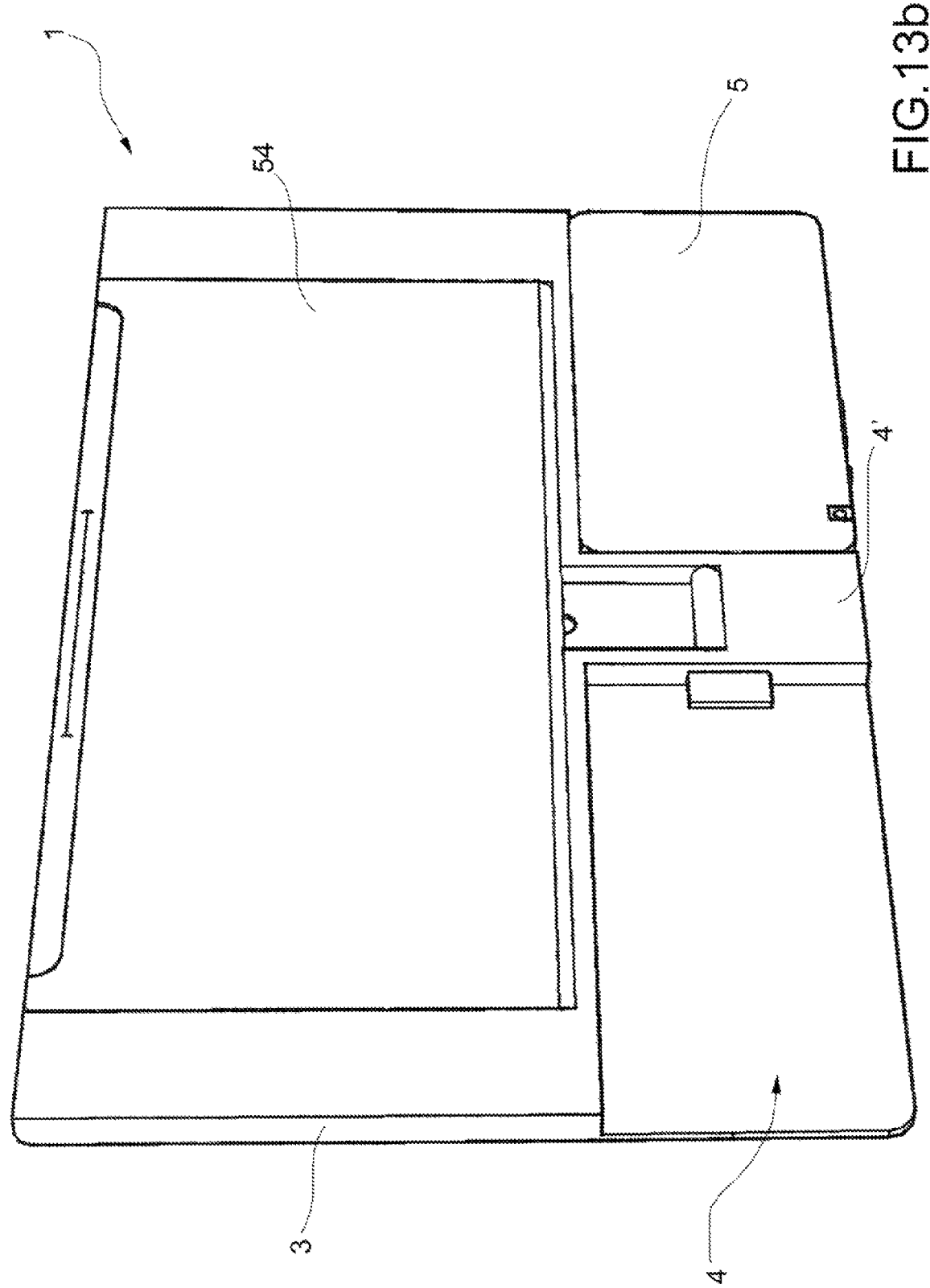

MODULAR COMPUTING SYSTEM

TECHNICAL FIELD

The present disclosure concerns the field of computing systems and, in particular, modular computing systems that can be transformed to enable different modes and configurations of use.

More specifically, the present invention relates to a display according to the preamble of claim 1 and a computing system comprising said display.

BACKGROUND OF THE DISCLOSURE

Known modular computing systems comprise a display according to the preamble of claim 1 and a mobile communication and/or computing device suitable to be arranged in a seat of this display, so that the latter can show contents controlled by the mobile device, for example to have a device with a larger screen.

A keyboard may be attached to said display but the resulting system is not more comfortable or functional than a common laptop.

U.S. Pat. No. 6,807,050 discloses a configurable display having an integrated docking station, for accepting computing means, on the rear side of the display. A support for the display is housed at the rear side of the display, and said support comprises a first tubular frame slidable in a plane parallel to the display, adapted to act as a handle for carrying the display with one hand, and a second tubular frame rotatable with respect to the plane of the display, adapted to arrange the display close to a supporting surface or a wall at a predetermined vision angle. The resulting system does not allow the display to be arranged on a horizontal working plane according to configurations different from an inclined resting on said plane.

SUMMARY OF THE DISCLOSURE

It is therefore an object of the present disclosure to provide a system which is free from the disadvantages of the prior art. Said object is achieved with a display and a computing system, whose main features are disclosed in the attached claims, which are an integrating part of the present description.

Thanks to its particular folding support, and to the possibility of joining a mobile communication and/or computing device in a removable way, the display according to the present disclosure may take on a number of operating conditions, among which a flat configuration for free transport as a tablet, a configuration for resting on a horizontal surface with a variable angle of the screen (also known as "stand" mode), a further configuration for resting on a horizontal surface with a reduced amount of space occupied by the support (also known as "tent" mode) and a configuration of rest in an elevated position on a horizontal surface (also known as "desktop" mode) and may be used in combination with a (wireless or wired) keyboard for building a complete computing system adapted not only to take on the configurations common to a last generation notebook/laptop lying on this surface, but also a configuration where the display is separated and raised with respect to the surface where the keyboard rests, so as to improve the ergonomics and extend the usability of the resulting system, which can be thus used like a smartphone, a tablet, a laptop or a desktop computer, according to the user's needs.

Moreover, thanks to its modular structure, the computing resources of the system can be concentrated in a mobile device that may be coupled to the display, while the devices suitable to enhance the system, such as the batteries and the interfaces for peripherals, can be distributed among the other components of the system, such as the display, its folding support and/or the keyboard, or coupled to the display instead of the mobile device when the latter is detached from the display and connected thereto wirelessly or by wire.

The resulting system is also easy to transport and relatively inexpensive, thanks to the particular arrangement and distribution of its components.

Furthermore, a significant cost reduction is possible thanks to the modular design of the system, which avoids any duplication of expensive components, such as CPUs, displays, memories, etc.). Said duplication is usually present when a user owns several non-modular devices, such as smartphone, tablet, laptop or desktop computer, that are separated and do not form a single computing system.

The mobile device to be used in the system may be a device of third parties available on the marked or a dedicated device, which can then have a dedicated connector, for connecting to the display, and accessories such as, for example, a rotatable camera and/or expansion slots to improve the functions of the system.

BRIEF DESCRIPTION OF THE FIGURES

Further advantages and features of a computing system according to the present disclosure will become clear to those skilled in the art from the following detailed and non-limiting description of some embodiments thereof with reference to the attached drawings, wherein:

FIGS. 9a and 9b show rear perspective views of the computing system of FIG. 1 passing from a tablet-like configuration to the third configuration of use;

FIG. 10 shows a rear perspective view of the computing system of FIG. 1 in the third configuration of use;

FIGS. 13a-13f show a fourth embodiment of the foldable support of the display of the computing system according to the present description.

EXPLANATORY EMBODIMENTS

Figure 1:
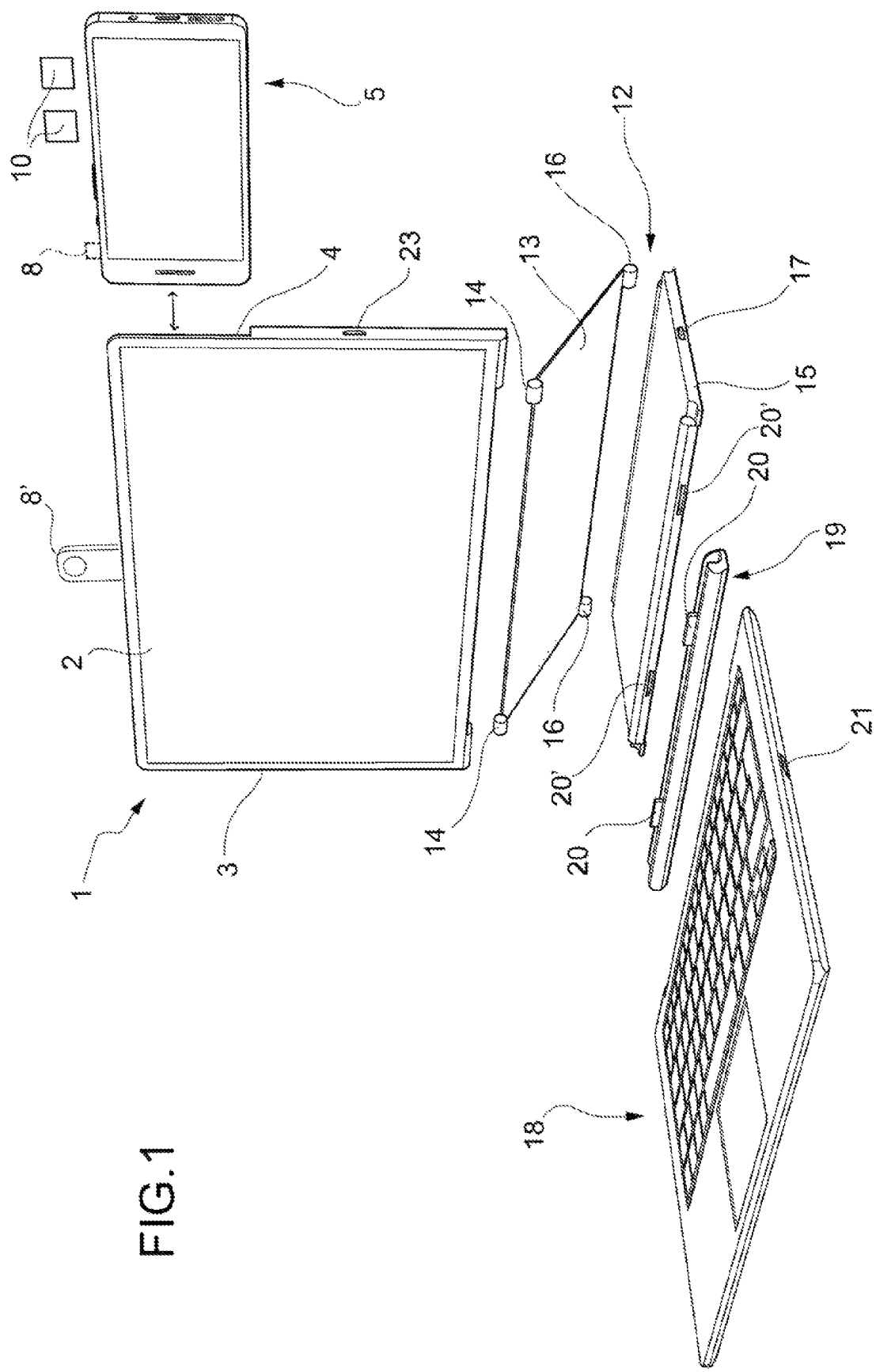
FIG. 1 shows an exploded view of a first embodiment of the computing system.
Figure 2:
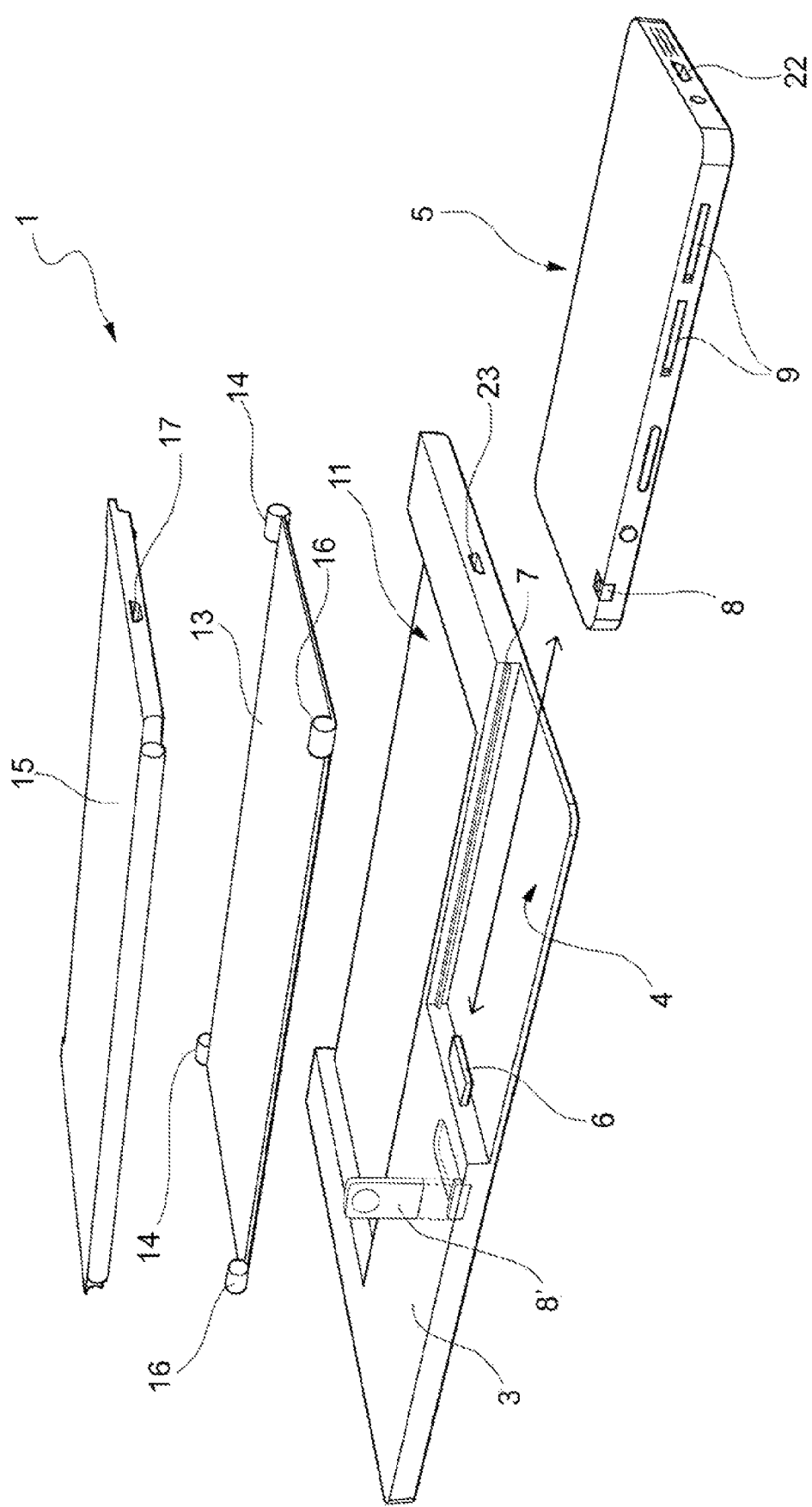
FIG. 2 shows a rear perspective exploded view of the computing system of FIG. 1 without the keyboard, i.e. of the display according to the present description.

Referring to FIGS. 1 and 2, the system according to the present disclosure comprises at least one display 1 provided with a screen 2, for example a flat screen, for example a LED or LCD touchscreen, arranged in a casing 3 having a substantially parallelepiped shape. The front and rear sides of the display 1 are wider than the top and bottom sides, which are in turn wider than the lateral sides, so that when seen frontally, the display 1 has a substantially rectangular shape which, according to a currently preferred orientation, has its base greater than its height. One or more corners or edges of the display 1 may be rounded. The screen 2 is arranged on the front side of the display 1. The casing 3 of the display 1 includes electric and electronic devices, also of a known type, for showing contents on the screen 2 according to control signals received by these devices. These devices may also include batteries and/or interfaces.

A first seat 4 for housing a mobile communication and/or computing device 5, in particular a smartphone, a mini-PC, a tablet, a docking station or the like, which has for example a substantially parallelepiped flat shape, is arranged on the rear side of the display 1, so that the mobile device 5 can be at least partially arranged in the first seat 4 and releasably coupled to the display 1. The first seat 4 comprises connecting means, for example a connector 6 which can be inserted into a complementary connector (not visible in the figures) arranged on one side of the mobile device 5, for example its lower side. The first seat 4 is shaped as a cavity having a substantially parallelepiped shape, with its wider sides arranged substantially parallel to the front side of the display 1 and—in a currently preferred embodiment not intended to limit the invention—its longer edges also substantially parallel to the longer edges of the display 1, so that the mobile device 5 can be arranged, for example, horizontally, i.e. as shown in FIG. 2, in the first seat 4, with the front side of the mobile device 5, that in the case of a smartphone comprises a screen, oriented for example toward the display 1. The connector 6 projects into the cavity of the first seat 4, which is preferably arranged at one upper corner of the display 1.

Preferably two or three sides, mutually perpendicular to each other, of the first seat 4 may be at least partially open, so that also two or three sides, mutually perpendicular to each other, of the mobile device 5 are accessible from the outside of the display 1 and its casing 3 when this device is arranged in the first seat 4. At least one side of the first seat 4 may be provided with at least one protrusion or recess, for example a rib 7 projecting from the lateral longer side of first seat 4 and parallel to the longitudinal axis of this side, so as to create a mechanical connection between the first seat 4 and the device 5 and hold the mobile device 5 within the first seat 4. Said protrusion or recess 7 may be complementary to a corresponding recess or protrusion, respectively, formed on one side of the mobile device 5, so as to improve the mechanical connection between the first seat 4 and the device 5. This mechanical connection can be further improved by magnets (not visible in the figures) arranged around the first seat 4 and/or in the mobile device 5.

The mobile device 5 is preferably provided with a camera 8 mounted on a rotatable support, so as to be suitable to be extracted from the mobile device 5 when arranged in the first seat 4 to project from one side of the mobile device 5 and/or of the display 1, in particular from its top side.

Advantageously, the display 1 may be equipped with a pivotable support hinged to the casing 3, which provides a connection to a module comprising at least a camera 8' and/or other optical devices (for example a flash unit). Owing to the pivotable support the module connected thereto may be rotated from a rest position where it is at least in part comprised within the outline of the casing so as to project from a side of the display 1, particularly from its top side. Compared with the common prior art case where a camera is arranged in the front part of the display and another one in the rear side, the adopted solution allows, with the same dimensions of the casing 3 of the display 1, to include in said casing a screen 2 having greater dimensions, thus keeping the portability needed for a tablet, tent and stand configuration and, at the same time, providing a screen that better satisfies the size needs of the desktop configuration where the screen itself is arranged at a greater distance from the viewer.

The connector 6 is suitable to provide a mechanical connection, possibly also by means of one or more magnets arranged in the connector 6 and/or in the mobile device 5, and/or to transmit electricity and/or data, in particular video and/or audio data, from the mobile device 5 to the display 1, in particular to the devices in the casing 3 which control the screen 2, so that this data can be converted into contents shown on the screen 2 and/or sounds emitted from one or more speakers (not visible in the figures) arranged in the casing 3. Further data of a different kind can be transmitted through the connector 6 from the mobile device 5 to the display 1, and/or vice versa. The connector 6 may comprise a protrusion as in FIG. 2 or have different shapes, for example including power/data pins. The mechanical connection may advantageously create a thermal contact between the sides of the mobile device 5 and those of the first seat 4 corresponding to each other, and this forms a passive cooling system for the mobile device 5 since heat generated therefrom diffuses also to the display 1. In alternative or in addition, data may be exchanged wirelessly, for example through Bluetooth or Wi-Fi interfaces, between the mobile device 5 and the display 1. The mobile device 5 may be provided with one or more slots 9 for memory supports 10, in particular containing data for enabling the control of the display 1 and/or of devices connected to the latter.

The rear side of the display 1 is also provided with a second recessed seat 11 in which a foldable support 12 can be arranged at least partially. In the embodiment where the seat 4 in the rear part of the display 1 is oriented horizontally, the longer edges of the seat 4 are parallel to the longer edges of the casing 3 and the use of the space available behind the display 1 is consequently optimized. The foldable support 12 comprises at least one first portion 13 rotatably connected to the casing 3 of the display 1 by means of one or more first hinges, for example friction hinges, 14 and at least one second portion 15 rotatably connected to the first portion 13 by means of one or more second hinges, for example friction hinges, 16. The first portion 13 and second portion 15 of the foldable support 12 preferably have a substantially parallelepiped flat shape with substantially the same rectangular extension, so that they can be folded in the second seat 11 and the thickness of the foldable support 12 is—for example in a currently preferred embodiment—substantially corresponding to the depth of said second seat 11. The foldable support 12 can be extracted from the second seat 11 by pulling out the first portion 13 and/or the second portion 15, which rotate horizontally, namely around a pair of distinct axes, substantially parallel to an edge of the display 1, for example to one of the longer edges, by means of the hinges 14 and/or 16. The second portion 15 of the foldable support 12 preferably comprises power supply means, in particular one or more batteries, fixed or removable from the second portion 15, which power supply means are electrically connected to the casing 3 and/or to the connector 6, to provide electricity to the display 1 and/or the mobile device 5 when it is arranged in the first seat 4, or otherwise connected by wire to the display 1. The first portion 13 of the foldable support 12 preferably comprises electric conductors to transmit data and/or electricity from the second portion 15 to the casing 3, and/or vice versa. The power supply means, being relatively heavy, concur to stabilize the display 1 when the foldable support 12 is extended from the second seat 11 and thus the screen 2 of the display 1 can be arranged vertically at a given distance from the second portion 15 of the foldable support 12, which may rest on a surface. The screen 2 of the display 1 can also be inclined frontwards or backwards by means of the hinges 14 and/or 16. The second portion 15 of the foldable support 12 may also comprise at least one socket 17 for transmitting and/or receiving data or electricity through a cable connected to this socket.

The first portion 13 and the second portion 15 of the foldable support 12 are movable in order for the foldable support to take on a plurality of alternative configurations, which include:
  a compact configuration wherein the first portion 13 and the second portion 15 lie at least partially within the second seat 11;
  a first partially open configuration wherein the first portion 13 lies at least partially within the second seat 11 and the second portion 15 shows an opening angle with the first portion 13 by rotation about the second hinges 16, so that the second portion of the foldable support is placed on a resting plane with an edge;
  a second partially open configuration wherein the first portion 13 and the second portion 15 are coplanar or parallel with each other and show an opening angle with the display 1 by rotation about the first hinges 14, so that the second portion of the foldable support lies on a resting plane of the display 1 and the display 1 is placed on the resting plane;
  an extended configuration wherein the first portion 13 shows an opening angle with the display 1 by rotation about the first hinges 14 and the second portion 15 shows an opening angle with the first portion 13 by rotation about of the second hinges 16, so that the second portion of the foldable support lies on a resting plane of the display 1 and the display 1 is in a raised position with respect to said resting plane.

The first hinges 14 and/or the second hinges 16 may possibly include mechanical and/or electrical and/or magnetic blocking and/or unblocking mechanisms that allow a user to move the first portion 13 and/or the second portion 15 of the support 12 as desired. These mechanisms greatly simplify the transformation in the various configurations that the support 12 may take on. For example, if the display 1 lies on a resting surface with the screen 2 facing upwards and the support 12 in its compact configuration, unblocking the hinges 14 and 16 allows to take the support in its open configuration by simply raising the casing 3 of the display 1, when grasped at its lateral sides in a suitable way. Once the casing 3 of the display 1 has been moved to the desire height, it is sufficient to block the hinges 14 and 16 to cause the support 12 to stay in the desired position.

The system of the present disclosure may comprise also a keyboard 18 having substantially the same rectangular extension of the display 1, so that they can be arranged one on the other and overlap entirely or almost entirely. The keyboard 18 comprises a pivotable joint or is suitable to be coupled with at least one separate rotatable joint 19, suitable to be coupled in turn to the free edge of the second portion 15 of the foldable support 12, which edge is opposite to the edge rotatably connected to the first portion 13 of the foldable support 12. In order to improve the mechanical coupling, the rotatable joint 19 preferably comprises at least one groove suitable to receive at least partially said free edge of the second portion 15 of the foldable support 12, as well as at least partially the lower edge of the casing 3. The rotatable joint 19 allows a rotation of the keyboard 18 with respect to the display 1 when they are mutually connected. The rotatable joint 19 is preferably provided with connecting means, such as one or more first connectors 20 and one or more second connectors (not visible in the figures) suitable to cooperate with a free edge or with end portions of a pair of opposing lateral edges of the second portion 15 of the foldable support 12, which are equipped with complementary connectors 20' for providing a mechanical connection, also by means of one or more magnets arranged in the connectors, and/or an electrical connection, respectively, to transmit data and/or electricity from the keyboard 18 to the second portion 15 of the foldable support 12, and/or vice versa, successively forwarded from the foldable support 12 to the casing 3 of the display 1 and/or the connector 6, and/or vice versa. The keyboard 18 may also be provided with at least one further socket 21 for the transmission of electricity and/or data with the display 1 and/or the mobile device 5 and/or external devices by means of a cable connected to the socket 21. Data may also be transmitted or received by the keyboard 18 through a wireless connection. Also the mobile device 5 may have a socket 22 arranged on the side opposite to the side connectable to the connector 6 of the display 1. The display 1 may also be provided with at least one further socket 23 for the transmission of electricity and/or data with the mobile device 5 and/or the keyboard 18 and/or external devices by means of a cable connected to the socket 23.

Alternatively, the first connectors 20 are designed so as to form a direct mechanical connection with the casing 3 of the display 1, by means of connectors 20" (shown in FIG. 9b) at an edge or at end portions of a pair of opposing lateral sides of said casing, that show complementary connecting seats, in order to provide a mechanical and/or electrical connection for exchanging data and/or electricity with an interface accessory device or with a power supply accessory device.

Figure 3:
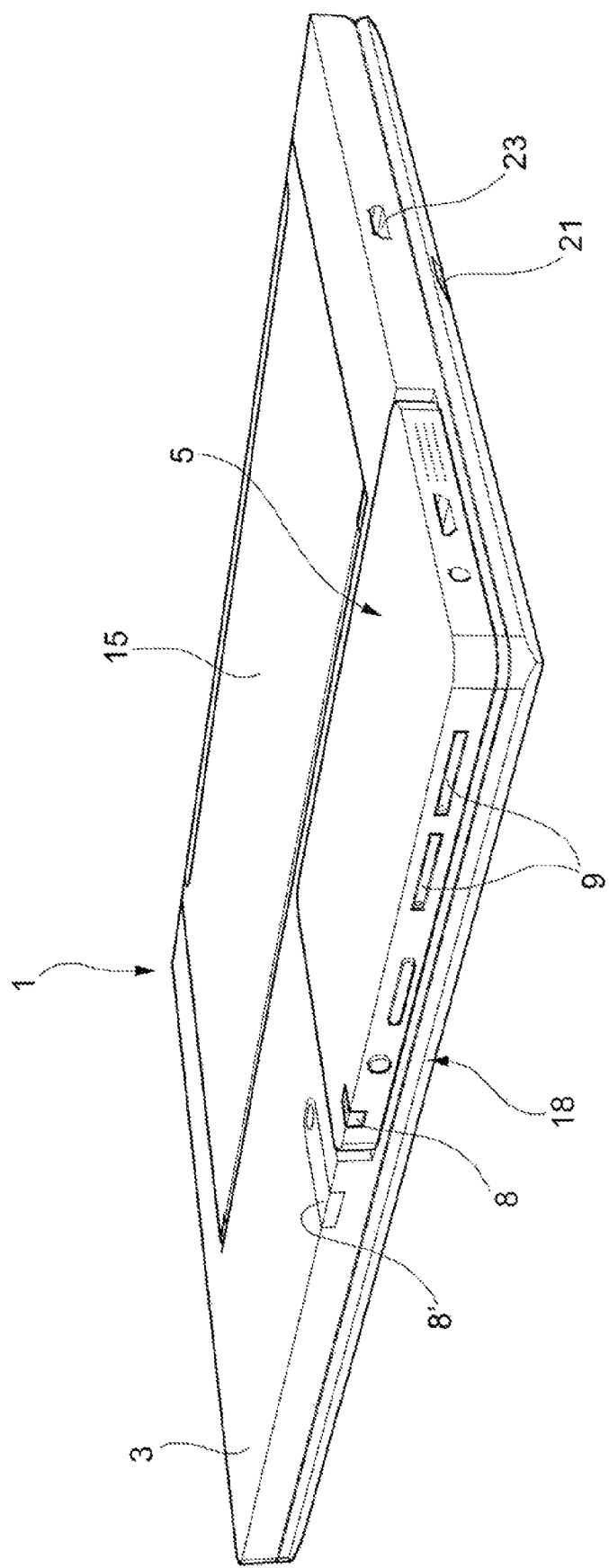
FIG. 3 shows a rear perspective view of the computing system of FIG. 1 in a closed configuration.

FIG. 3 shows the keyboard 18 joined to the second portion 15 of the foldable support 12 by means of the rotatable joint 19 (not visible in the figure), which foldable support 12 takes on a compact configuration and is arranged in the second seat 11. The display 1 is in turn arranged between the keyboard 18 and the foldable support 12, with the casing 3, the first portion 13 of the foldable support, the second portion 15 of the foldable support and the keyboard 18 arranged in a substantially parallel manner one beside the other. The mobile device 5 may be arranged in the first seat 4 of the display 1, so that the combination of the casing 3, the mobile device 5, the foldable support 12 and the keyboard 18 has a substantially parallelepiped shape.

Figure 4A:
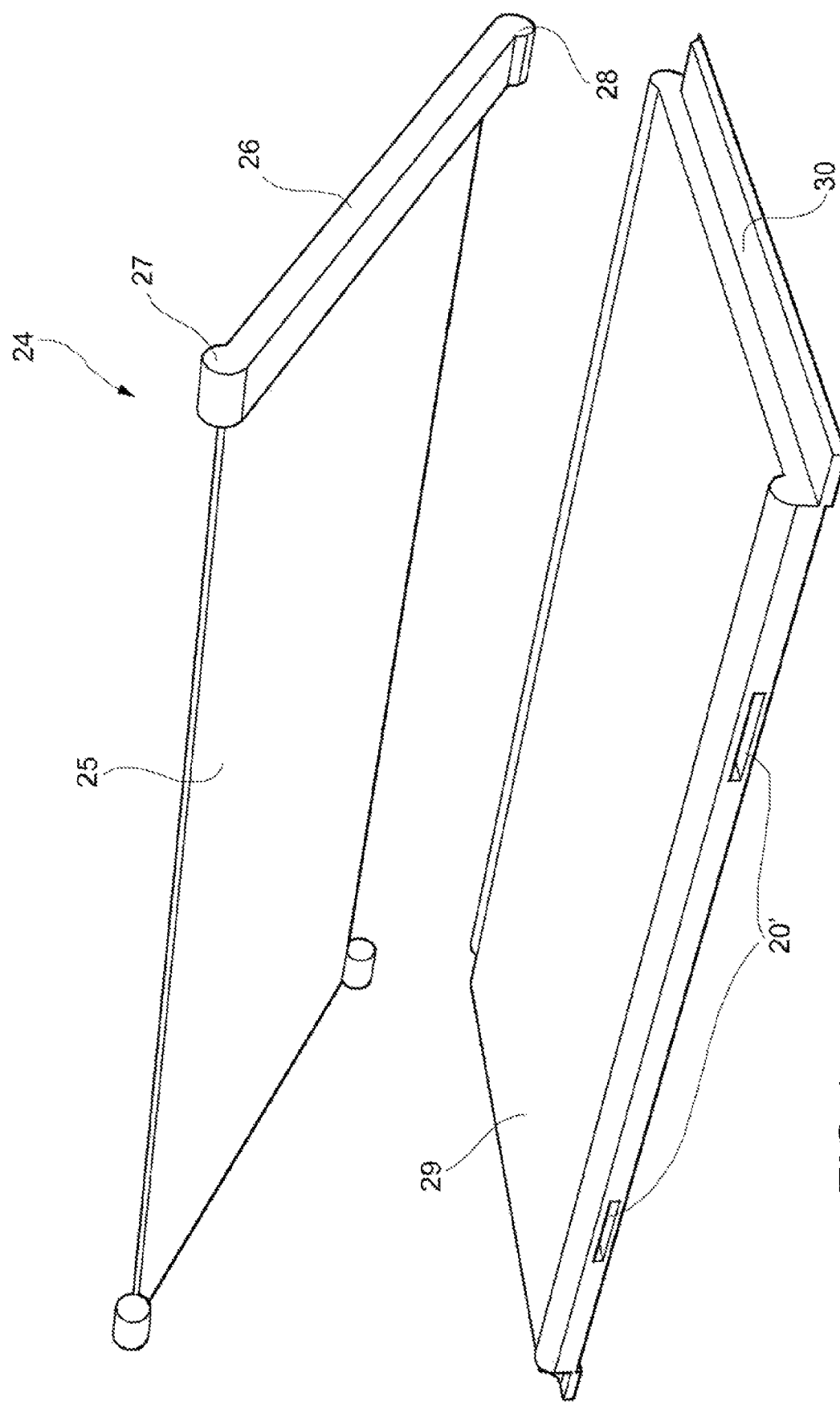
FIGS. 4a, 4b and 4c show front perspective views of two variants of a second embodiment of the foldable support for the display of the computing system of FIG. 1 and an overall perspective view of the display of the computing system with the second variant of the foldable support.

FIG. 4a shows a second embodiment of the foldable support 24, similar to the first embodiment 12, in which support however the first portion 25 comprises a casing 26 extending along at least one lateral edge of the first portion 25 and projecting towards the second portion 29 of the foldable support 24, which second portion comprises at least one recess 30 suitable for housing the casing 26 of the first portion 25. In the case wherein first hinges 27 and second hinges 28 are arranged at the edges of the first portion 25, the casing 26 extends from a respective first hinge 27 to a respective second hinge 28.

The casing 26 includes conductors for transmitting data and/or electricity from the second portion 29 to the casing 3, and/or vice versa. If the foldable support 24, at each of the two lateral edges of the first portion 25, is provided with a casing 26, the part of the first portion 25 between the two casings 26 can be partially or entirely empty, so that the first portion 25 is formed only or almost only by the two casings 26, as shown in FIG. 4b.

Figure 4B:
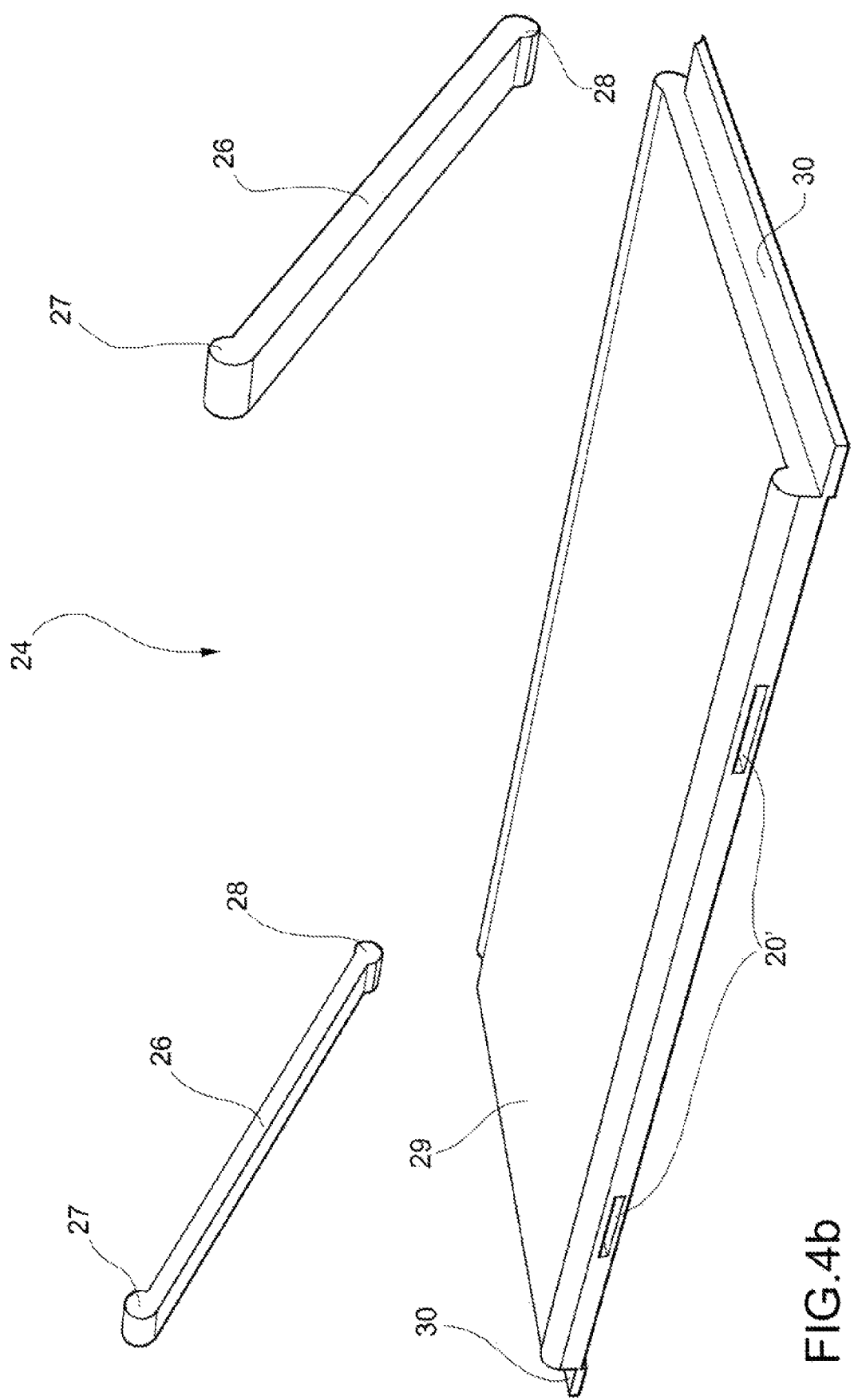
Figure 4C:
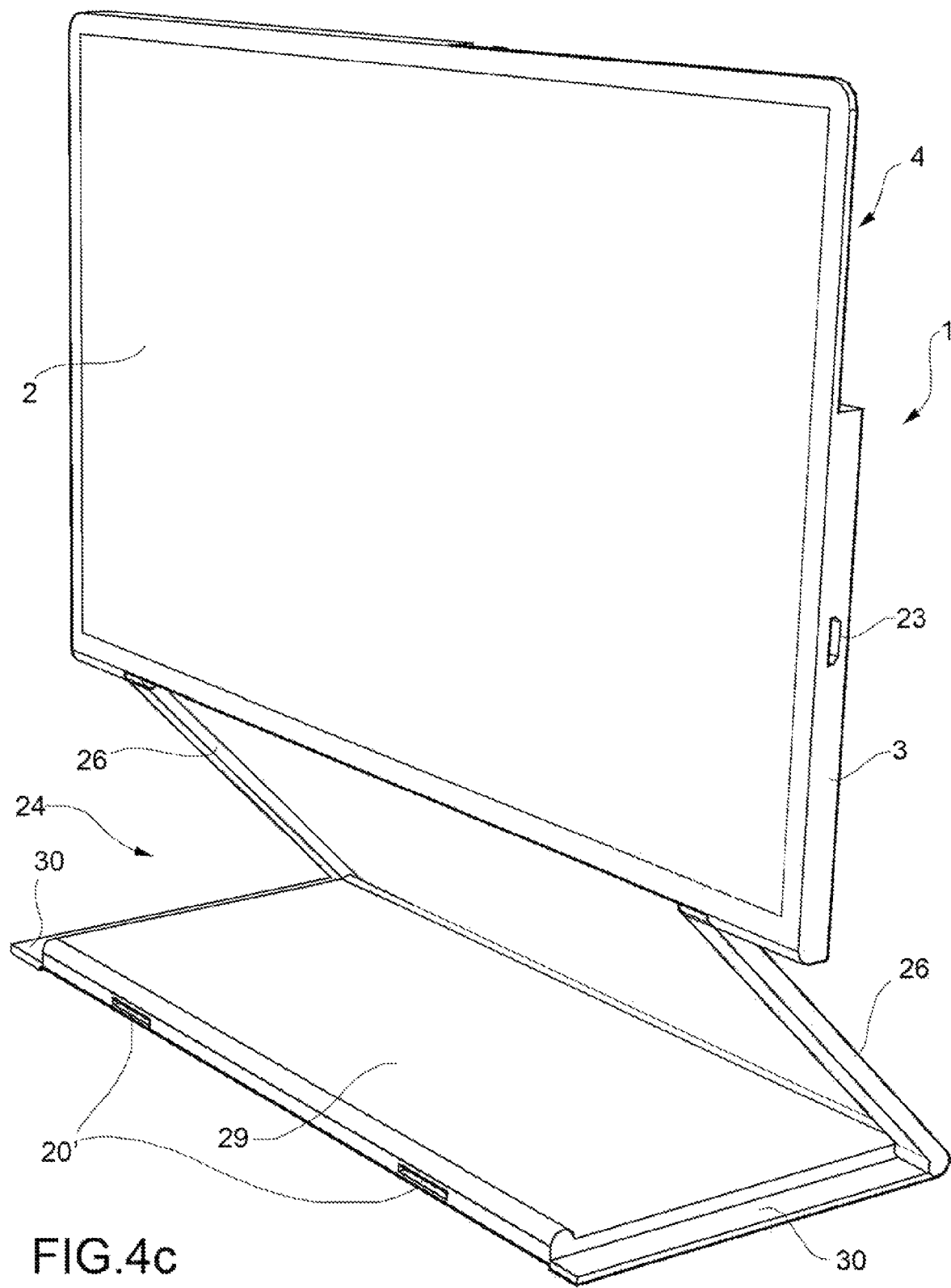

FIG. 4c shows in a prospective view the display wherein the foldable support, according to the embodiment of FIG. 4b, takes on an extended configuration and the display is in a raised position with respect to a resting plane.

Figure 5:
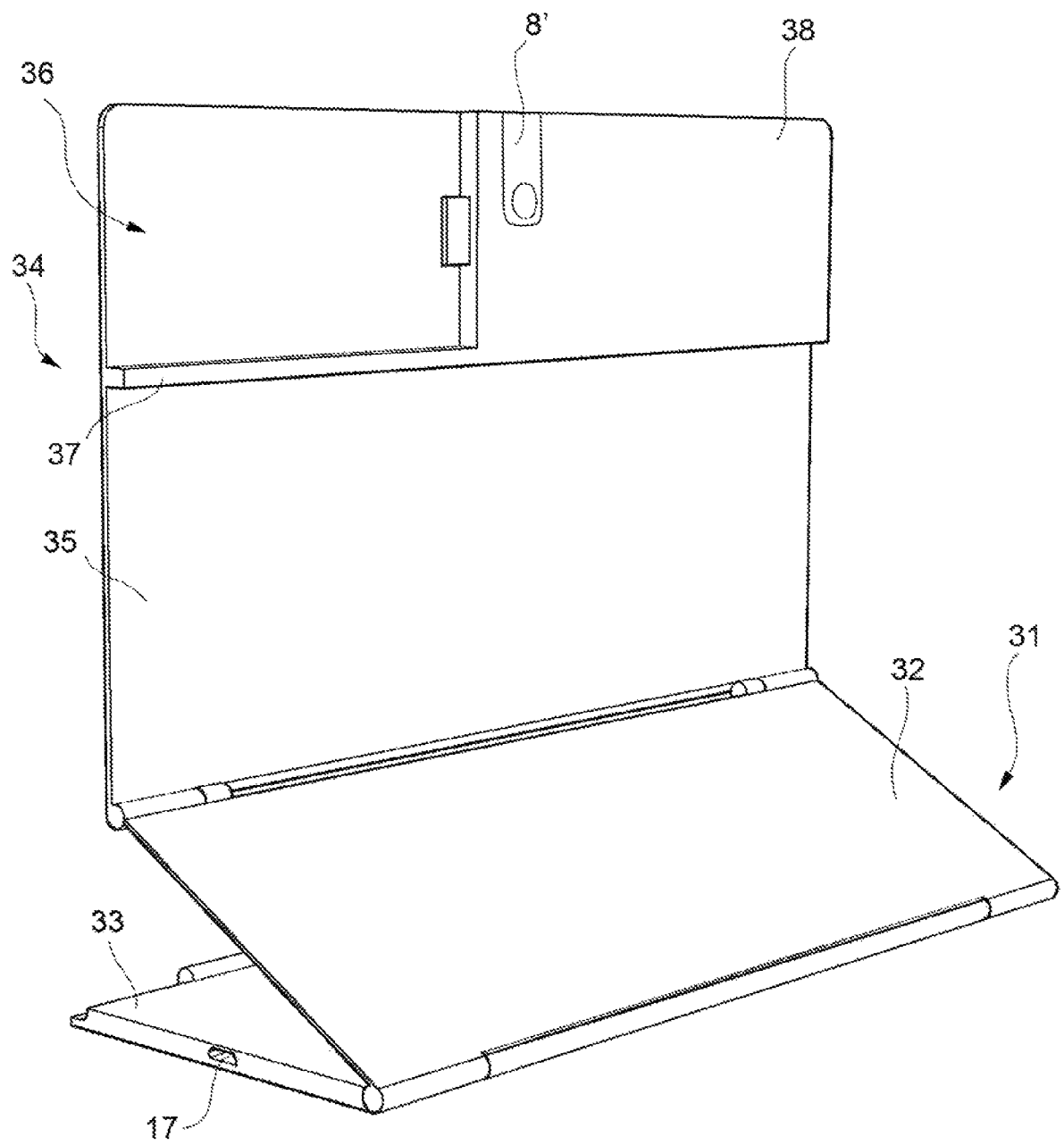
FIG. 5 shows a rear perspective view of a third embodiment of the foldable support of the display of the computing system according to the present description.

FIG. 5 shows a third embodiment of the foldable support 31, similar to the first embodiment 12 or the second embodiment 24, in which support however the first portion 32 and/or the second portion 33 have substantially the same width of the display 34, so that one or both lateral sides of its second seat 35 may be open. As in the first embodiment of the display 1, the first seat 36 and the second seat 35 are divided by a wall 37 made in the casing 38 of the display 34. In the figure it is also visible the camera 8' in the rest position wherein it is comprised within the outline of the casing.

Figure 6:
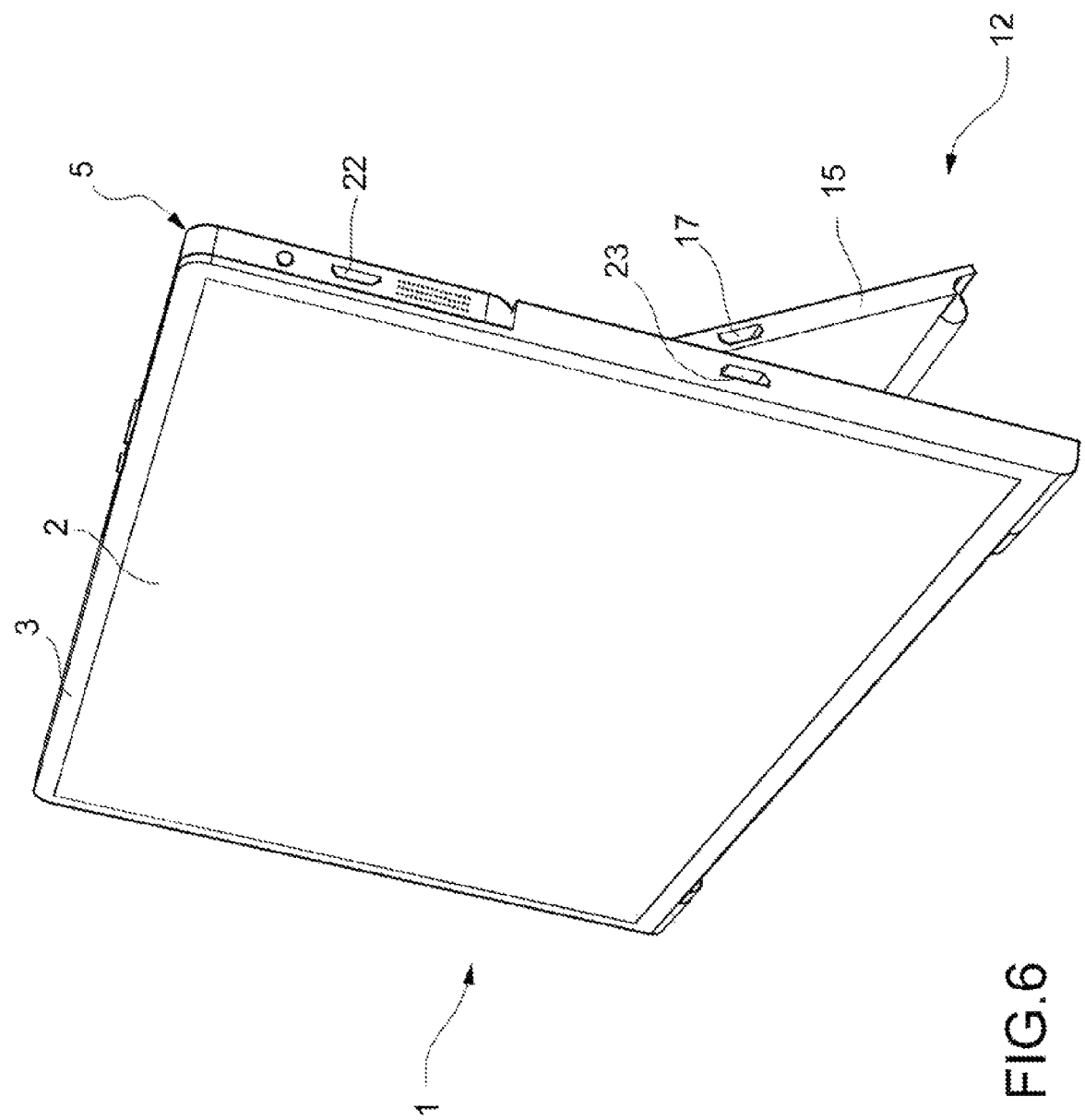
FIG. 6 shows a front perspective view of the display of the computing system of FIG. 1 in a first configuration of use.

FIG. 6 shows the second portion 15 of the foldable support 12 rotated outwardly from the casing 3 of the display 1, so as to form an angle of around 30° with the screen 2. In this configuration the foldable support takes on a first partially open configuration, and the display 1 can be arranged on a surface with the screen 2 forming an angle of around 105° with this surface and with a minimal occupation of space. The free edge of the second portion 15 of the foldable support 12 is oriented downwards and backwards, so as to contact the surface supporting the display 1. The mobile device 5 is arranged in the first seat 4 and the first portion 13 of the foldable support 12 remains in the second seat 11. The keyboard 18 and the rotatable joint 19 are detached from the display 1, however the keyboard 18 may still communicate with the display 1 and/or the mobile device 5 by means of a cabled or wireless connection. The sockets 17, 22 and 23 of the second portion 15, the mobile device 5 and the display 1, respectively, are accessible from one side, for example the right side, of the display 1.

If both the first portion 13 and the second portion 15 of the foldable support 12 are arranged in the second seat 11 of the display 1, the display 1 can be used as a tablet, in which case, since the display 1 has a narrow bezel, namely covering almost the same extension of the screen 2, in order to prevent the fingers of the user to cover the contents displayed on the edges of the screen 2, the area of the screen 2 used for showing the contents displayed may be rescaled. This rescaling is triggered by the control apparatuses in the display 1 when the following conditions are simultaneously verified:
   the mobile device 5 is arranged in the first seat 4 of the display 1;
   the keyboard 18 is not joined to the display 1;
   both the first portion 13 and the second portion 15 of the foldable support 12 are arranged in the second seat 11.

Figure 7:
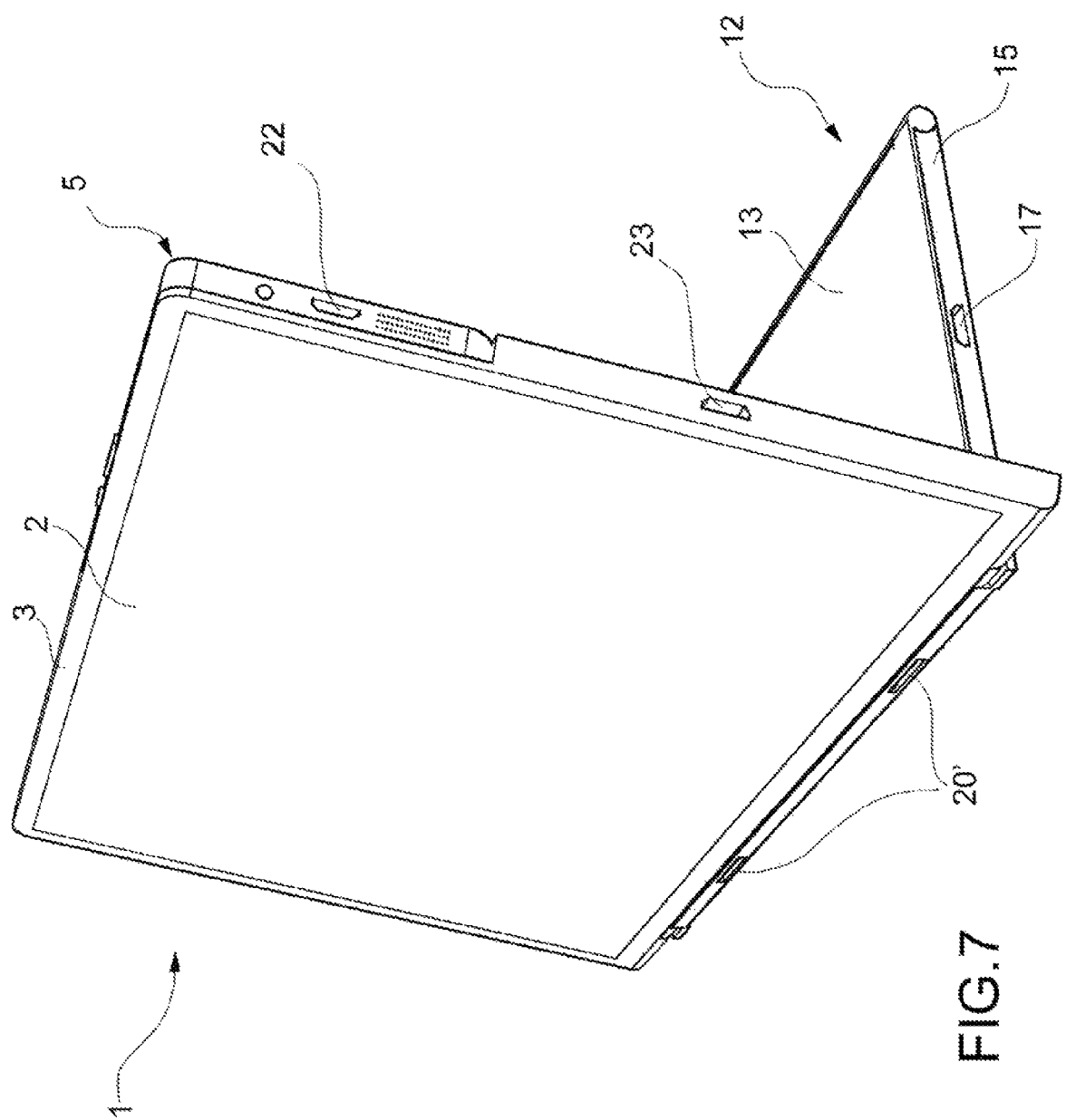
FIG. 7 shows a front perspective view of the display of the computing system of FIG. 1 in a second configuration of use.

FIG. 7 shows a configuration similar to the configuration of FIG. 6, in which however both the first portion 13 and the second portion 15 of the foldable support 12 are rotated outwardly from the casing 3 of the display 1, so as to form an angle of around 75° with the latter. In this configuration the foldable support takes on a second partially open configuration, and the display 1 can still be arranged on a surface with the screen 2 forming an angle of around 105° with this surface and with an increased stability compared to the configuration of FIG. 6, since the second portion 15 may lie on the surface supporting the display 1, so as to increase the bearing area and to lower the center of gravity of the display 1.

Figure 8:
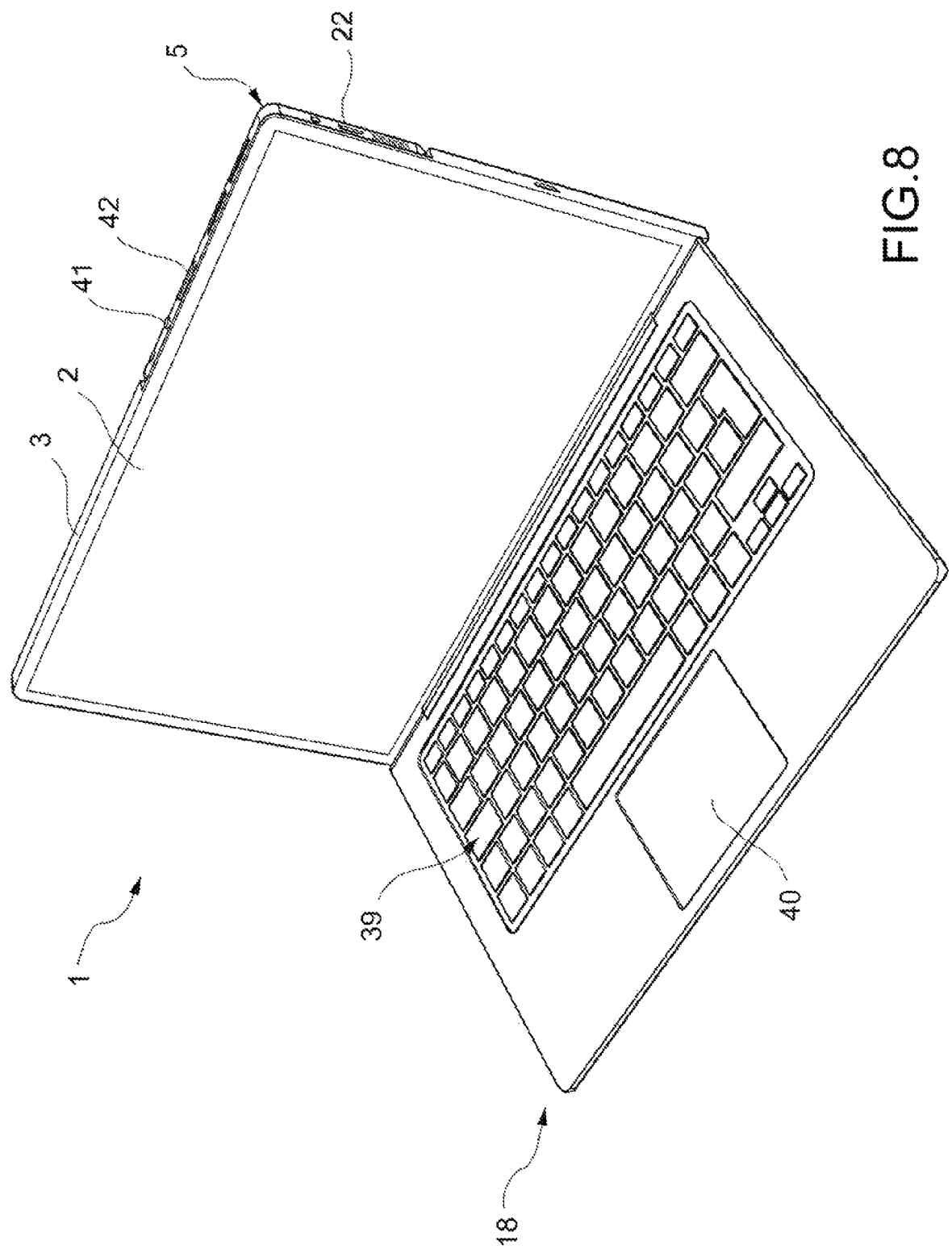
FIG. 8 shows a front perspective view of the computing system of FIG. 1 in a third configuration of use.

FIG. 8 shows a configuration in which the keyboard 18 is joined to the display 1 by means of the rotatable joint 19, so that the keyboard 18 may rest on a surface and the display 1 can be rotated so that the screen 2 forms an angle of around 105° with this surface. The mobile device 5 is arranged in the first seat 4 and both the first portion 13 and the second portion 15 of the foldable support 12 are arranged in the second seat 11. The keyboard 18 may comprise a key set 39 and a touchpad 40. One or more batteries may also be arranged inside the keyboard 18 with the purpose of extending the overall autonomy of the system. In this case, the battery in the keyboard 18 is preferably of a different kind compared to the battery inside the second portion 15 of the foldable support 12. For instance, the keyboard 18 and the second portion 15 could be each equipped with one or more batteries more suited to the supply of short-term or long-term peak powers, respectively. For each task, software of the mobile device 5 would choose to drain power from the battery more suited to that particular task. This approach can significantly increase the efficiency in the utilization of the power resources available to the computing system.

An on/off switch 41 and a volume control 42 of the mobile device 5 may be reached at the top side of the display 1, preferably aligned with the top side of the display 1, so as to remain accessible to the user also when the mobile device 5 is docked to the display 1.

FIG. 9a shows a tablet-like configuration, in which the mobile device 5 is arranged in the first seat 4 of the display 1 and the first portion 13 and the second portion 15 of the foldable support 12 are both arranged in the second seat 11 of the display 1. To obtain the laptop-like configuration of FIG. 8, the free edge of the second portion 15 and the lower edge of the casing 3 can be inserted into the groove of the rotatable joint 19 hinged to the keyboard 18, so that the connectors 20 project towards the complementary connectors 20" at the free edge of the second portion 15. To improve the stability of the resulting system, the free edge of the second portion 15 of the foldable support 12 is provided with at least one recess 43 in which a portion of the rotatable joint 19 is arranged when it is attached to the display 1, as shown in FIG. 10. This mechanical connection can be further improved by magnets (not visible in the figures) arranged in the rotatable joint 19 and/or in the free edge of the second portion 15 and/or in the lower edge of the casing 3.

Figure 9B:
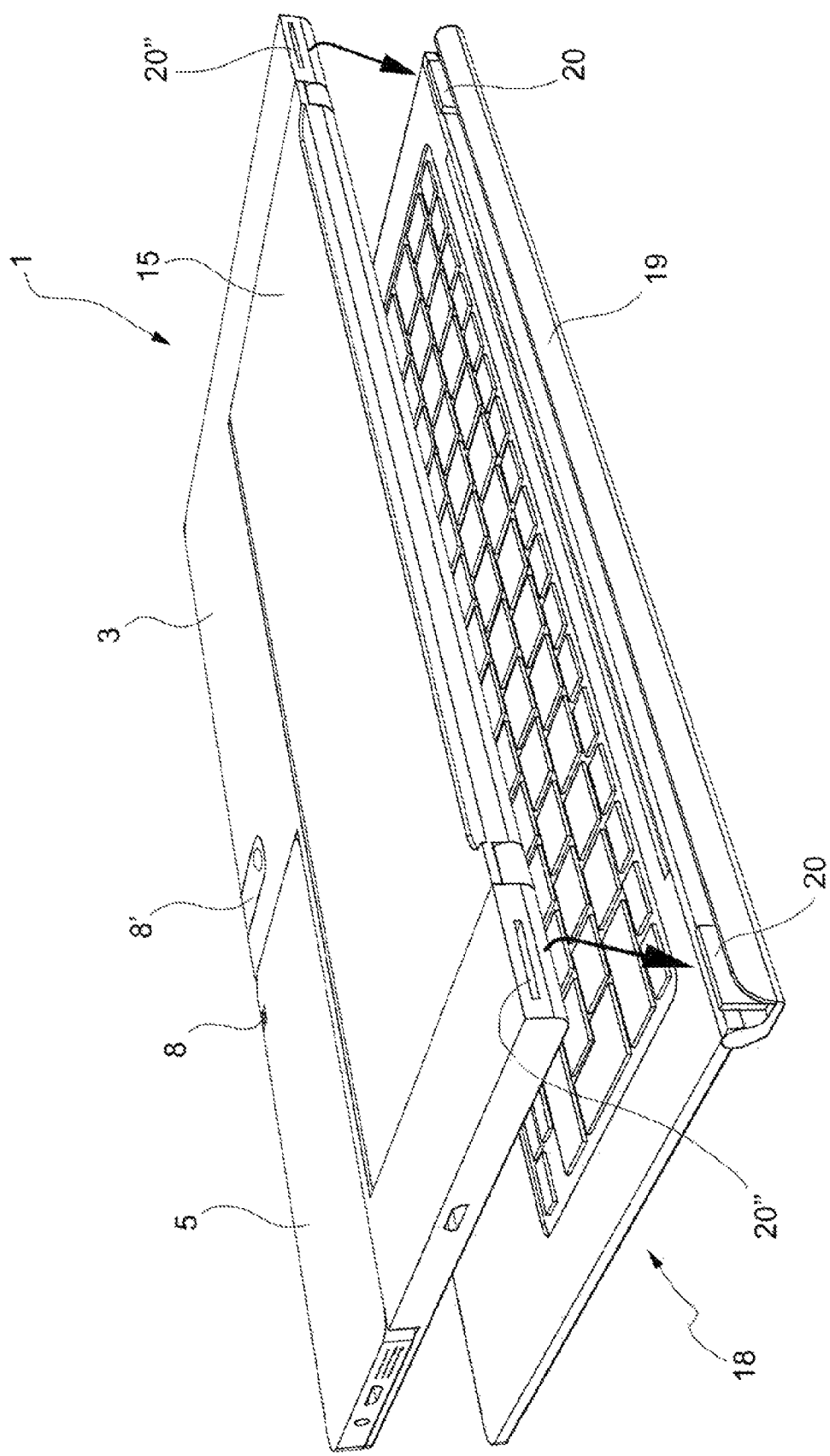

FIG. 9b shows the alternative embodiment wherein the pivotable joint 19 coupled to the keyboard 18 has first connectors 20 which cooperate directly with complementary connectors 20" of the casing 3 of the display 1, at a bottom edge of said casing.

Figure 11:
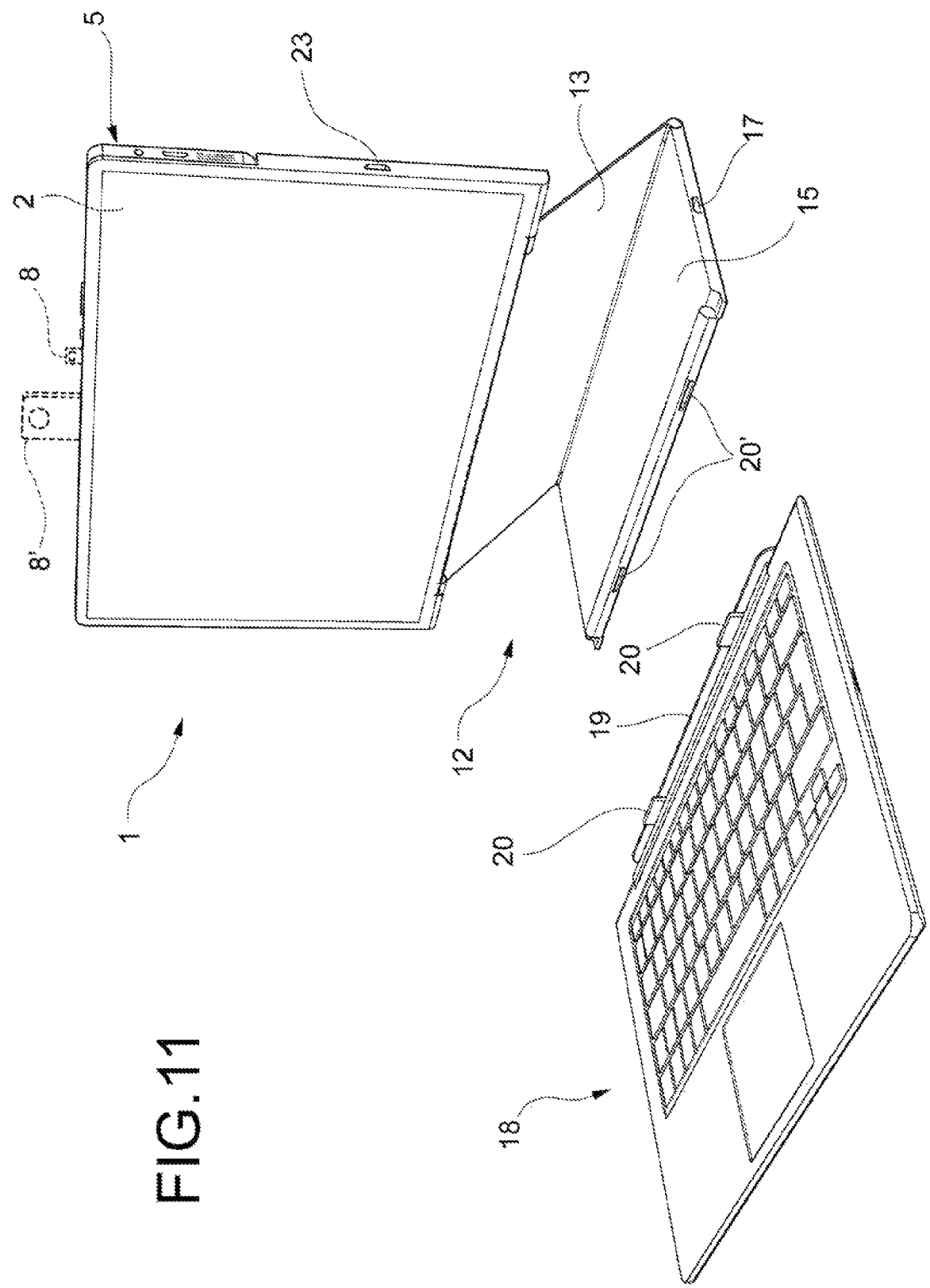
FIG. 11 shows a front perspective view of the system of FIG. 1 in a fourth configuration of use.

FIG. 11 shows a configuration in which the keyboard 18 is not joined to the display 1 but communicates wirelessly with the mobile device 5, which is housed in the first seat 4. The camera 8 of the mobile device 5 or the camera 8' of the display (both drawn with hatched lines, since they are optional) may be rotated outwards so that it projects from the mobile device 5 and/or from the top side of the display 1 to be oriented toward the user of the system. The foldable support 12 is extended, so that its first portion 13 is rotated with an angle of around 150° with respect to the display 1 and its second portion 15 forms an angle of around 60° with the first portion 13. With this configuration, the screen 2 of the display 1 can be arranged in a substantially vertical and elevated position with respect to the second portion 15, which can be used as a base for supporting the display 1 on a horizontal resting surface.

Figure 12:
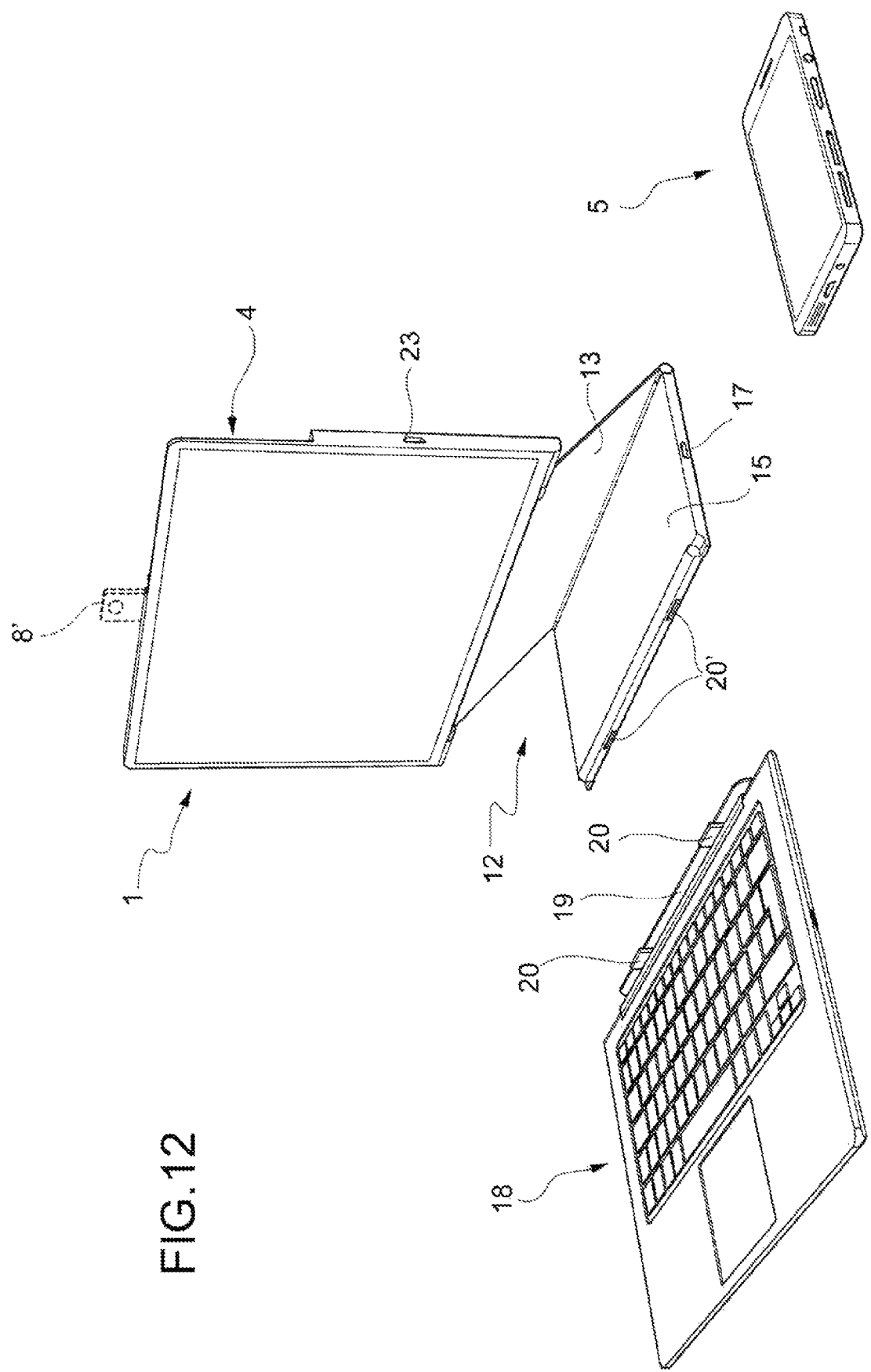
FIG. 12 shows a front perspective view of the system of FIG. 1 in a fifth configuration of use.
Figure 13A:
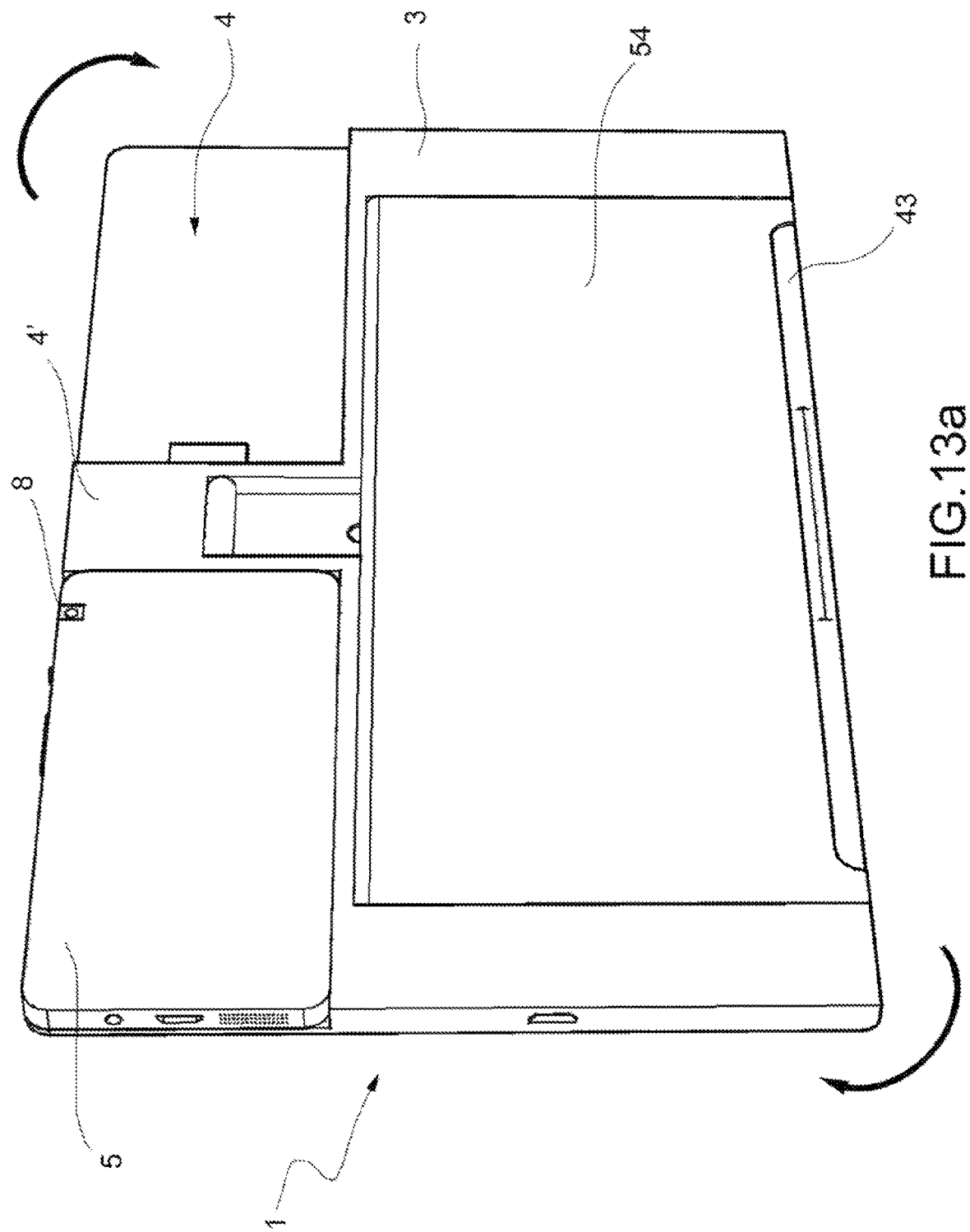
Figure 13C:
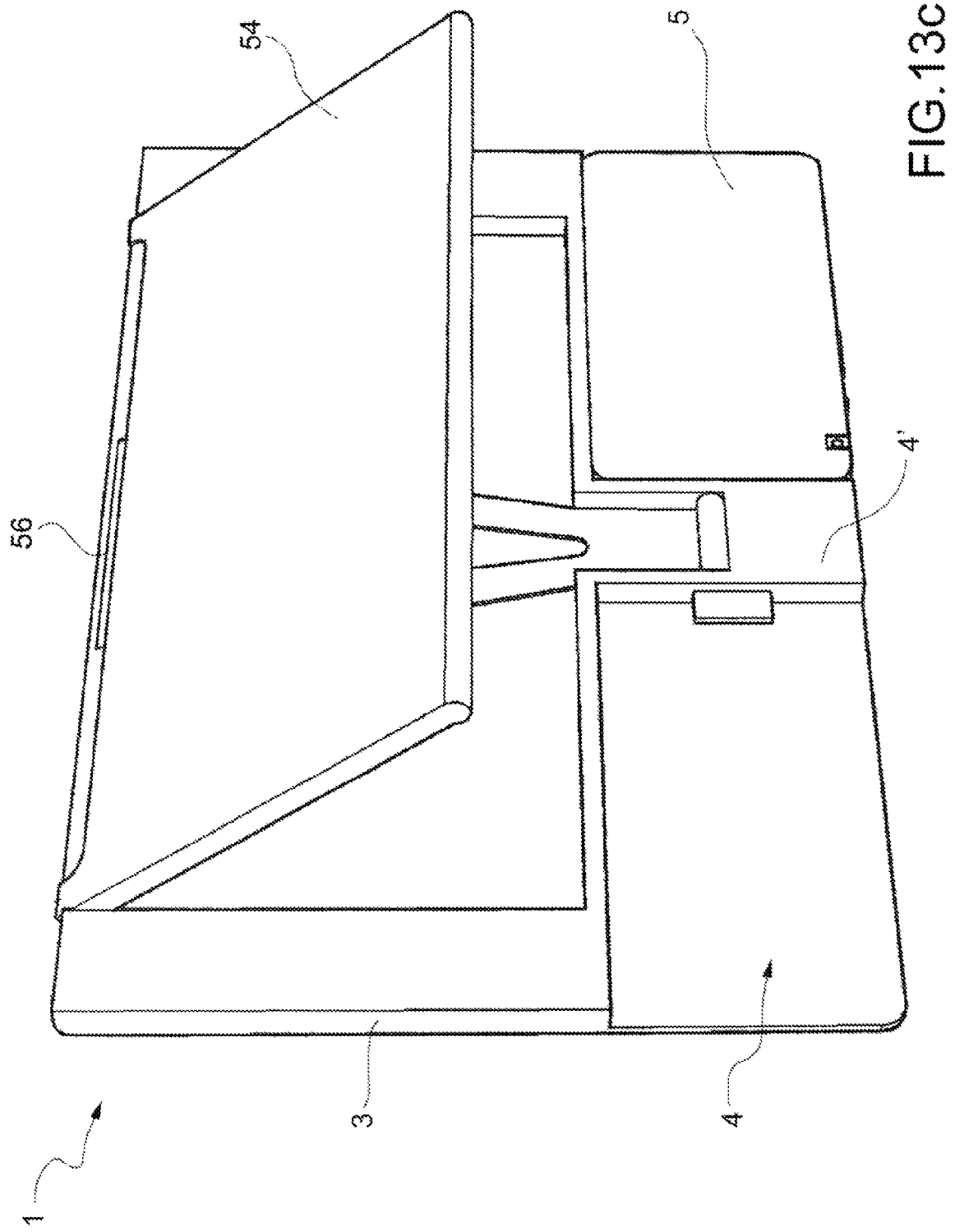
Figure 13D:
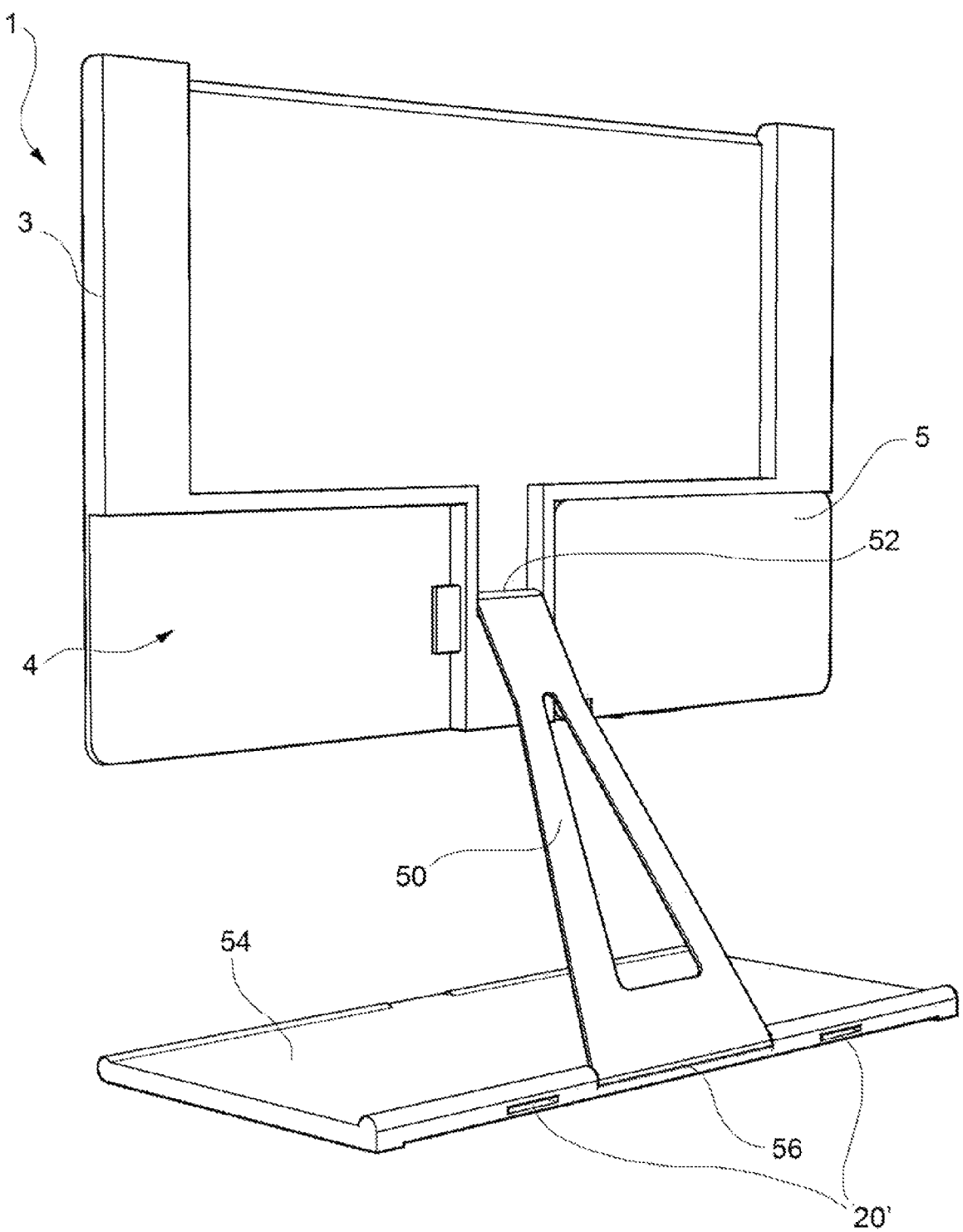
Figure 13E:
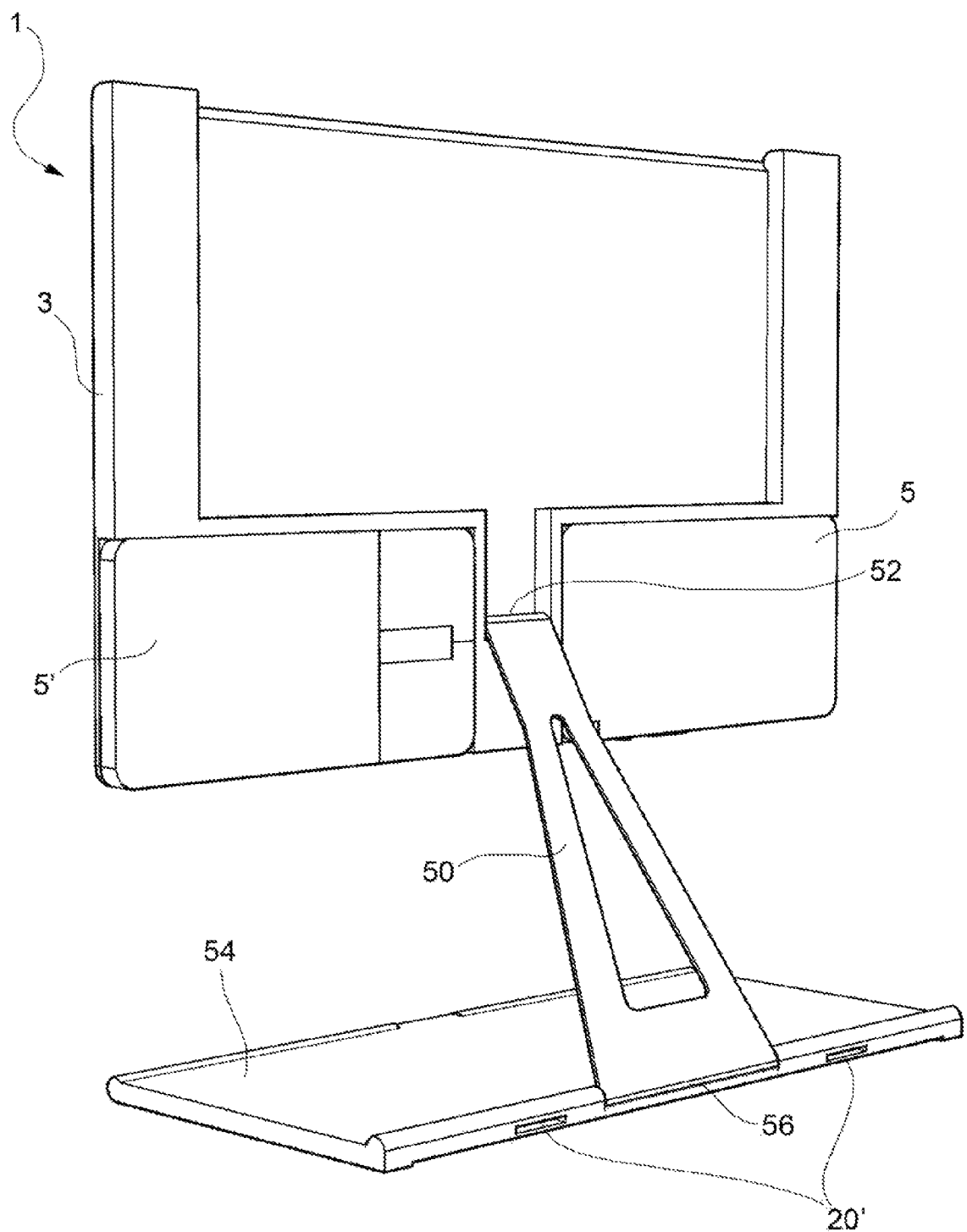
Figure 13F:
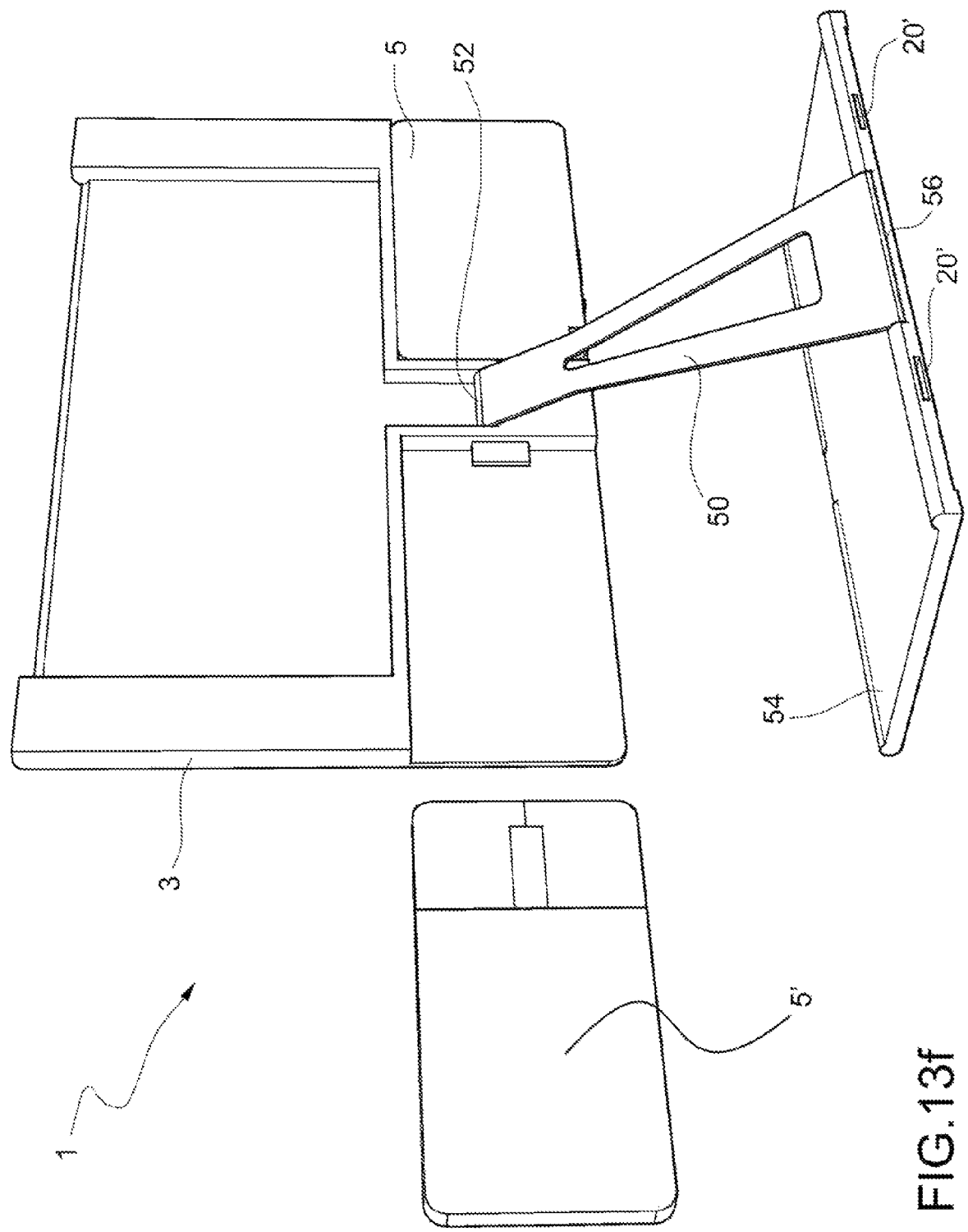

FIG. 12 shows a configuration similar to the previous one, in which the computing mobile device 5 or an external computing mobile device is however detached from the display 1 and communicates wirelessly with it, for example through a docking station that may be housed in the seat 4 or communication means integrated in the display 1, and with the keyboard 18. As an alternative, the display 1, the mobile device 5 and/or the keyboard 18 may be connected to each other by one or more cables. The system may also include a mouse (not shown in the figures) and/or other peripherals connected wirelessly or by cable to the display 1, the mobile device 5 and/or the keyboard 18. In this configuration, the seat 4, when it is not engaged by a docking station, may be engaged by another electrical or electronic device, for instance by a supplementary electrical power storage/supply device, a supplementary connecting device, adapted to make available to a user a plurality of connecting modules or modules of a different type, a device for storing data or an interface device such as for example a extractable mouse.

In the above mentioned example, wherein a common smartphone available on the market is connected wirelessly with the display 1, the docking station takes on the role of the mobile device 5 and is, for example, a docking station equipped with a hardware arranged for implementing communication protocols (for example, Wi-Fi) and also coding/decoding (for example, H264) according to the current technologies (for example, Miracast and AirPlay) in order to reduce the bandwidth required by the wireless connection. Unlike a mobile device such as a smartphone or mini PC, which generates locally (inside it) the contents to show on the display or transmits to the display (wirelessly or by wire) contents obtained (wirelessly or by wire) from an device external to the system (for example, from an access point providing a Wi-Fi coverage), said docking station gathers contents to show on the display from another external device, for instance, a smartphone available on the market which, as such, cannot be docked into the seat 4 of the display. Advantageously, if the mobile device 5 is a docking station, the technology with which a wireless connection with an external device is established may be updated by simply replacing the docking station without changing the other components of the system.

FIGS. 13a to 13f show a fourth embodiment of the foldable support 12 of the display 1 of the computing system according to the present description. In this embodiment a pair of first seats 4, separated by a spacer 4', is provided on the rear side of the display, so as to house at the same time a first mobile communication and/or computing device 5, for example a smartphone, and a second mobile communication and/or computing device 5, for example a mini PC, or a different electric or electronic device such as a docking station, a supplementary electrical power storage/supply device, a supplementary connecting device, a device for storing data or an interface device such as for example a extractable mouse.

The foldable support may be extracted, as shown in the figures, with an orientation of the display which is substantially inverted compared with the orientation of the preceding figures, so as to take on an extended configuration wherein a first portion 50 is almost entirely turned upside down by rotation about at least a first hinge 52, such as for example a friction hinge, so as to show an opening angle with the display of about 120° and in any case adjustable at one's choice for regulating the tilt of the screen 2 with respect to the vertical direction, and a second portion 54 is rotated about at least a second hinge 56, such as for example a friction hinge, so as to show an opening angle with the first portion 50 of about 60° so that said second portion lies on a resting plane of the display and the display is in a raised position with respect to said resting plane.

Further variants and/or additions may be made by those skilled in the art to the embodiments here described and illustrated, remaining within the scope of the following claims. In particular, further embodiments of the disclosure may comprise the technical features of one of the following claims with the addition of one or more technical features, taken singularly or in any mutual combination, described in the text and/or illustrated in the drawings.

The invention claimed is:

1. A display provided with a screen arranged in a casing having a substantially parallelepiped shape, wherein the screen is arranged on the front side of the display and the casing includes electric and electronic devices for showing contents on the screen, wherein at least a first seat for housing a mobile communication and/or computing device is arranged on the rear side of the display, so that this mobile device can be at least partially arranged in the first seat, wherein the first seat comprises a cavity having a substantially parallelepiped shape, with its wider sides arranged substantially parallel to the front side of the display, characterized in that the rear side of the display is provided with a second recessed seat adapted to house at least partially a foldable support, wherein the foldable support comprises a first portion rotatably connected to the display by means of one or more first hinges and a second portion rotatably connected to the first portion by means of one or more second hinges, so that the foldable support can be extracted from the second seat by pulling out the first portion and/or the second portion, or the foldable support can be folded back in the second seat by pushing the first portion and/or the second portion, which are suitable to rotate around a pair of distinct axes substantially parallel to an edge of the casing, by means of said hinges, wherein said first portion and/or said second portion can be rotated to take on a plurality of alternative configurations, comprising:
   a first partially open configuration wherein said first portion lies at least partially within said second seat and said second portion shows an opening angle with said first portion at said one or more second hinges;
   a compact configuration wherein said first portion and/or said second portion lie at least partially within said second seat;
   a second partially open configuration wherein said first portion and said second portion are coplanar or parallel with each other and show an opening angle with the display at only said one or more first hinges, so that at least said second portion rests on a bearing surface of the display; and
   an extended configuration wherein said first portion shows an opening angle with the display at said one or more first hinges, and said second portion shows an opening angle with said first portion at said one or more second hinges; and
   wherein content to be displayed on the display is obtained from data that comprise at least data of one or more mobile communication and/or computing devices.

2. The display according to claim 1, wherein said first portion and said second portion are rotatably connected to the display and to the first portion, respectively, in order that the foldable support takes on a plurality of alternative configurations, which comprise:
- the compact configuration wherein said first portion and said second portion lie at least partially within said second seat;
- the first partially open configuration wherein said first portion lies at least partially within said second seat and said second portion shows an opening angle with said first portion by rotation about said one or more second hinges, so that said second portion is placed on said bearing surface with an edge;
- the second partially open configuration wherein the first portion and said second portion are coplanar or parallel with each other and show an opening angle with the display by rotation about said one or more first hinges; and
- the extended configuration wherein said first portion shows an opening angle with the display by rotation about said one or more first hinges, and said second portion shows an opening angle with said first portion by rotation about said one or more second hinges, so that said second portion lies on said bearing surface of the display and the display is in a raised position with respect to said bearing surface.

3. The display according to claim 1, wherein said first seat has its longer edges substantially parallel to the longer edges of the casing.

4. The display according to claim 1, wherein the first hinges and/or the second hinges include mechanical and/or electrical and/or magnetic blocking and/or unblocking mechanisms that allow a user to move as desired the first portion and/or the second portion of the support.

5. The display according to claim 1, in which said second seat is recessed in the rear side of the display and the thickness of said foldable support substantially corresponds to the depth of said second seat.

6. The display according to claim 1, wherein the first portion and the second portion of the foldable support have a substantially parallelepiped flat shape with substantially the same rectangular extension.

7. The display according claim 1, wherein the longer edges of the first seat and the second seat are substantially parallel.

8. The display according to claim 1, wherein the first seat is provided with at least one connector adapted to be inserted into a complementary connector arranged on one side of the mobile device.

9. The display according to claim 1, wherein the first seat is arranged at one corner of the display.

10. The display according to claim 1, wherein two or three sides, mutually perpendicular to each other, of the first seat are at least partially open, so that also two or three sides, mutually perpendicular to each other, of the mobile device are accessible from the outside of the display when this device is arranged in the first seat.

11. The display according to claim 1, wherein two or three sides, mutually perpendicular to each other, of the first seat are at least partially open, so that also two or three sides, mutually perpendicular to each other, of the mobile device are accessible from the outside of the display when this device is arranged in the first seat.

12. The display according to claim 2, wherein the second portion of the foldable support comprises power storage means adapted to provide electricity to the display and/or the mobile device when it is arranged in the first seat, or otherwise connected by wire to the display, said storage means having a predetermined mass such as to contribute to stabilize the display on a horizontal resting surface in the second partially open configuration and in the extended configuration.

13. The display according to claim 1, wherein the first portion of the foldable support comprises at least a casing extending along at least one lateral edge of the first portion and projecting towards the second portion of the foldable support, wherein the casing includes conductors for transmitting data and/or electricity from the second portion to the display, and/or vice versa.

14. The display according to claim 1, wherein the first portion and/or the second portion of the foldable support have substantially the same width of the display.

15. The display according to claim 1, further comprising:
- a module including at least one camera, mounted on a pivotable support hinged to said casing, so as to be rotated from a rest position wherein it is at least in part comprised within the outline of said casing to project from a side of the display.

16. The display according to claim 1, comprising:
- connecting means at an edge or at end portions of a pair of opposing lateral sides of said casing, adapted to provide a mechanical connection and/or to exchange data and/or electricity with an interface accessory device or a power supply accessory device.

17. The display according to claim 1, comprising:
- connecting means at, at least, an edge of said second portion of the foldable support, adapted to provide a mechanical connection and/or to exchange data and/or electricity with an interface accessory device or a power supply accessory device.

18. A computing system, comprising a display according to claim 1.

19. The computing system according to claim 18, further comprising:
- the mobile communication and/or computing device adapted to locally generate contents to show on the display, or adapted to transmit to the display contents from an external device.

20. The computing system according to claim 18, further comprising at least a keyboard comprising a rotatable joint or adapted to be coupled with a separate rotatable joint, said rotatable joint having connecting means adapted to cooperate with complementary connecting means at the free edge of the second portion of the foldable support of the display, or with complementary connecting means at an edge or at end portions of a pair of opposing lateral sides of said casing of the display.

21. The computing system according to claim 20, wherein the rotatable joint comprises at least one groove suitable to house at least partially said free edge of the second portion of the foldable support and/or the lower edge of the casing of the display.

22. The computing system according to claim 20, wherein the free edge of the second portion of the foldable support of the display is provided with at least one recess in which a portion of the rotatable joint is arranged when the rotatable joint is attached to the display.

* * * * *